(12) United States Patent
Bird et al.

(10) Patent No.: US 9,337,411 B2
(45) Date of Patent: May 10, 2016

(54) SLAT-CONSTRUCTED AUTONOMIC TRANSFORMERS

(71) Applicants: Ross W. Bird, Canton, PA (US); William M. Bradley, Lewisburg, PA (US); Gareth J. Knowles, Williamsport, PA (US)

(72) Inventors: Ross W. Bird, Canton, PA (US); William M. Bradley, Lewisburg, PA (US); Gareth J. Knowles, Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 667 days.

(21) Appl. No.: 13/646,546

(22) Filed: Oct. 5, 2012

(65) Prior Publication Data

US 2013/0278115 A1 Oct. 24, 2013
US 2014/0132118 A9 May 15, 2014

Related U.S. Application Data

(60) Provisional application No. 61/543,708, filed on Oct. 5, 2011.

(51) Int. Cl.
*H01L 41/047* (2006.01)
*H01L 41/107* (2006.01)
*H01L 41/27* (2013.01)
*H01L 41/083* (2006.01)

(52) U.S. Cl.
CPC ............ *H01L 41/27* (2013.01); *H01L 41/0471* (2013.01); *H01L 41/0833* (2013.01); *H01L 41/107* (2013.01); *Y10T 29/42* (2015.01)

(58) Field of Classification Search
CPC .................................................. H05B 41/2822
USPC ........................................... 310/359, 365, 366
See application file for complete search history.

(56) References Cited

U.S. PATENT DOCUMENTS

| | | | |
|---|---|---|---|
| 2,830,274 A | 4/1958 | Rosen et al. | |
| 3,764,848 A | 10/1973 | Berlincourt | |
| 4,392,074 A * | 7/1983 | Kleinschmidt et al. | ........ 310/327 |
| 4,752,712 A * | 6/1988 | Tomita et al. | .................. 310/328 |
| 5,278,471 A | 1/1994 | Uehara et al. | |
| 5,834,882 A | 11/1998 | Bishop | |
| 6,052,300 A | 4/2000 | Bishop et al. | |
| 6,147,439 A | 11/2000 | Takagi et al. | |
| 6,229,247 B1 | 5/2001 | Bishop | |
| 6,326,718 B1 | 12/2001 | Boyd | |
| 6,346,763 B1 * | 2/2002 | Moon | ........................... 310/359 |
| 6,362,559 B1 | 3/2002 | Boyd | |
| 6,480,086 B1 * | 11/2002 | Kluge et al. | .................. 336/200 |
| 6,597,084 B2 | 7/2003 | Hu et al. | |
| 7,019,993 B2 | 3/2006 | Carazo | |

(Continued)

FOREIGN PATENT DOCUMENTS

| | | | | |
|---|---|---|---|---|
| CN | 201233910 Y | 5/2009 | | |
| JP | 2009-021453 A * | 1/2009 | .............. | H01F 17/04 |

OTHER PUBLICATIONS

Yoo, J.H. et al.: "High power piezoelectric transformer for driving a 28 W fluorescent lamp," Proceedings of the 2000 12th IEEE International Symposium on Applications of Ferroelectrics, ISAF 2000 (2000).

(Continued)

*Primary Examiner* — Thomas Dougherty
(74) *Attorney, Agent, or Firm* — Cahn & Samuels, LLP

(57) ABSTRACT

Multilayered piezoelectric transformers, transformer elements and methods of constructing piezoelectric transformers are disclosed.

20 Claims, 17 Drawing Sheets

(56) References Cited

U.S. PATENT DOCUMENTS

| | | | | |
|---|---|---|---|---|
| 7,538,477 | B2* | 5/2009 | Fazzio et al. | 310/366 |
| 2001/0026113 | A1* | 10/2001 | Watanabe et al. | 310/359 |
| 2009/0142209 | A1 | 6/2009 | Hirata | |
| 2010/0296316 | A1 | 11/2010 | Bothe et al. | |

OTHER PUBLICATIONS

Pinto, M. et al.: "A Resonant, Frequency—Tracking, Step-Down Piezoelectric Transformer Based Converter," IEEE Energy Conversion Congress and Exposition (ECCE) (2010).

Cherif, A. et al.: "Radial Piezoelectric Transformer Study" International Journal of Sciences and Techniques of Automatic Control Computer & Engineering IJ-STA, Special Issue, CEM, Dec. 2008.

Zhou, Weige et al.: "R&D of a New Type Piezoelectric Transformer with a Composite Structure," Progress in Electromagnetics Research Symposium, Beijing, China (2009).

Liu, Chien-Yao, et al.: "Design and Modeling of the Step-Down Piezo Transformer," Proceedings of the EPAC 2006 Conference.

Bove, T., et al.: "New Type of Piezoelectric transformer with Very High Density," proc. 12th IEEE International Symposium on Applications of Ferroelectrics (2000).

Thang, Vo Viet et al.: "Investigation of the Optimum Design for a 10 W Step-down 3 layer Piezoelectric Transformer," Journal of the Korean Physical Society, 58, No. 3, Mar. 2011.

Guo, Mingsen et al.: "A study on the disk-shaped piezoelectric transformer with multiple outputs," Review of Scientific Instruments 78, 125103 (2007).

Kim, Insung et al.: "Ring-dot-shaped Multilayer Piezoelectric Step-down Transformers Using PZT-based Ceramics," Journal of the Korean Physical Society, vol. 57, No. 4, (2010).

Koc, B., et al.: "Design of a circular piezoelectric transformer with crescent-shaped input electrodes," Japanese Journal of Applied Physics, vol. 42, (2003).

Priya, S. et al.,: "High Power Universal Piezoelectric Transformer," IEEE Transformer Ultrasonic Ferroelectric Frequency Control 53, 810 (2006).

European Search Report, Dec. 11, 2014.

* cited by examiner

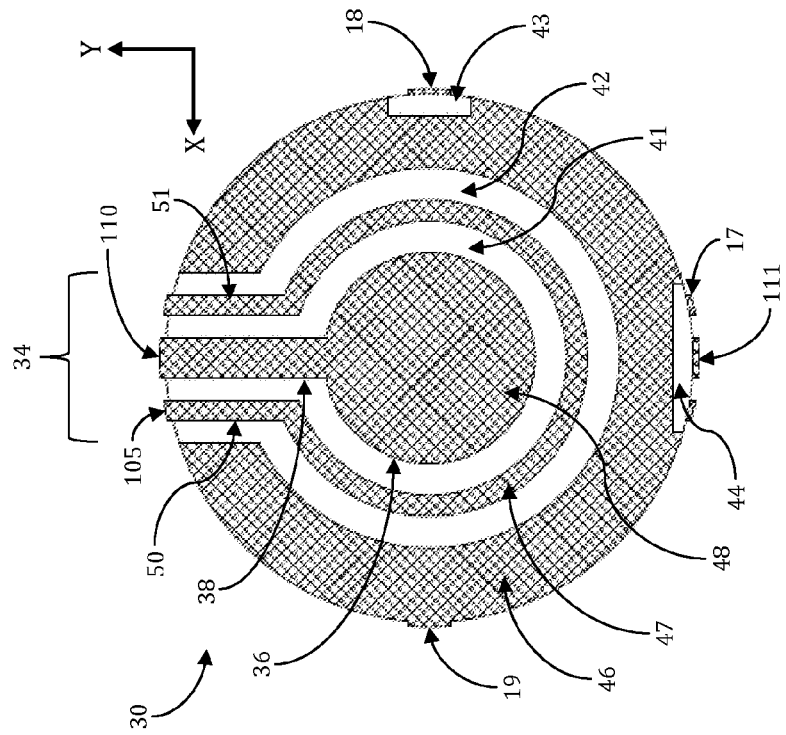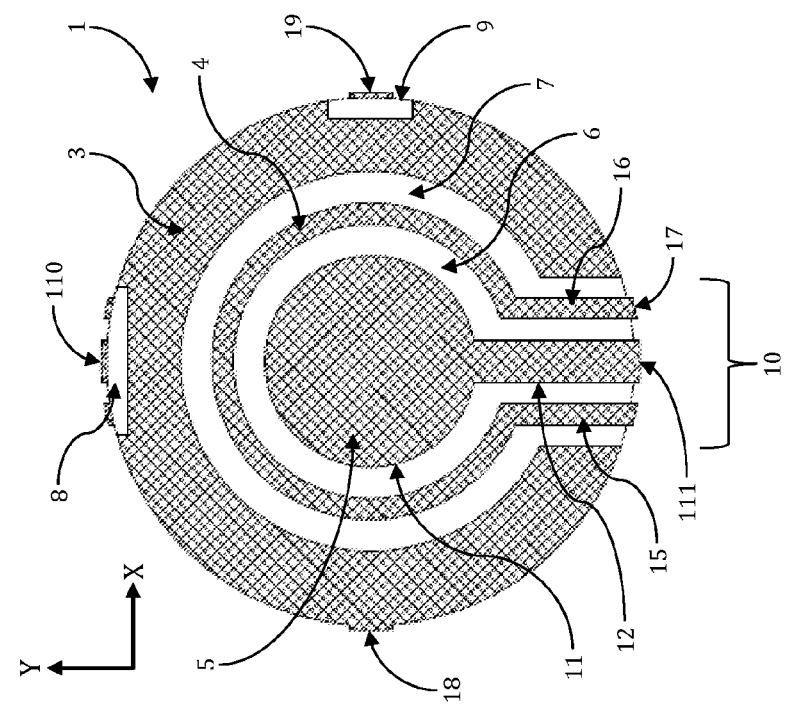

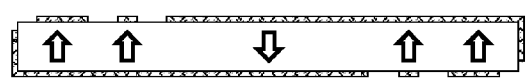
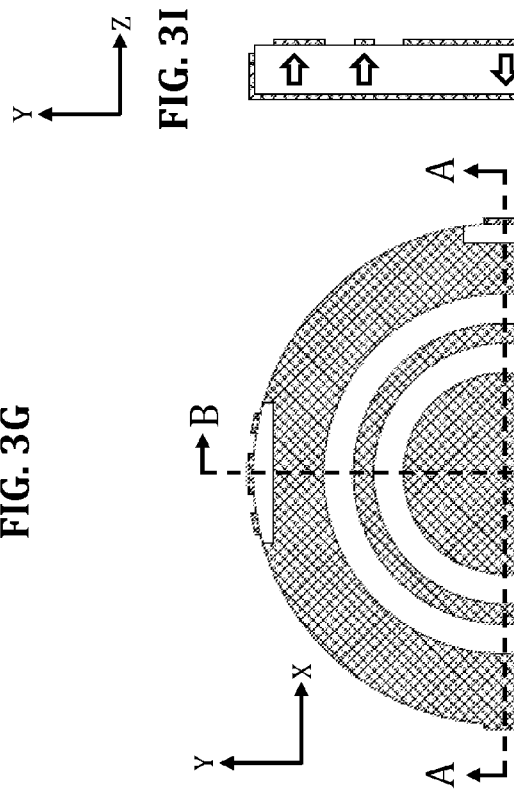
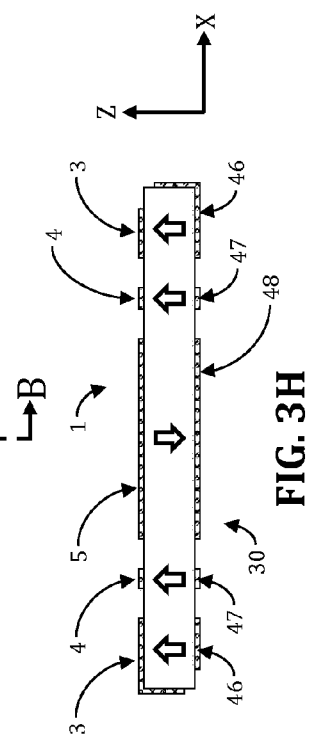

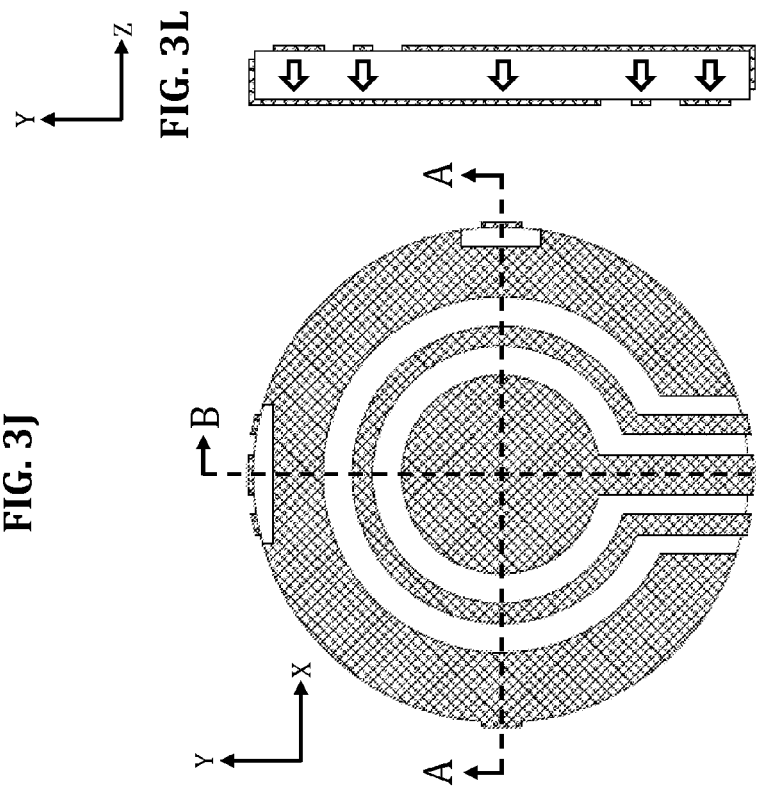
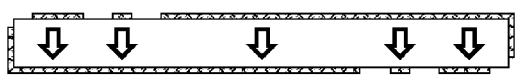
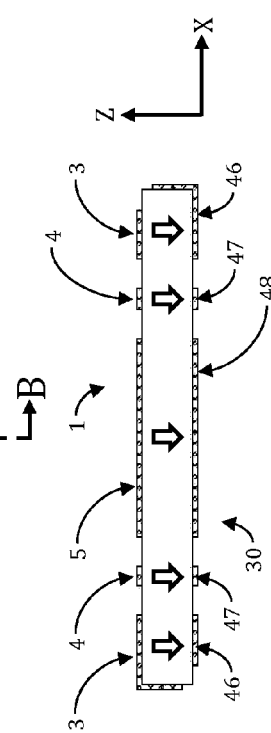
FIG. 3J
FIG. 3K
FIG. 3L

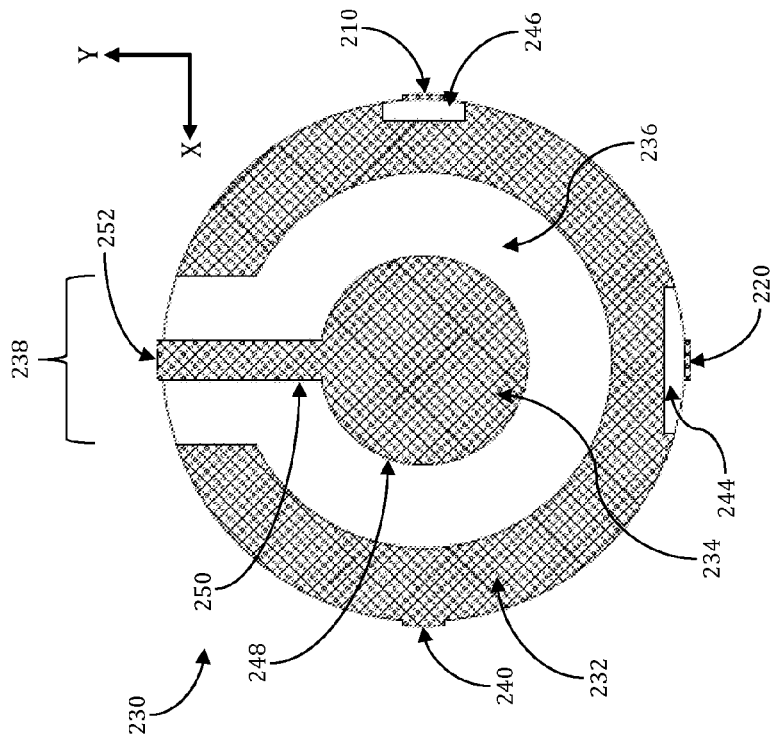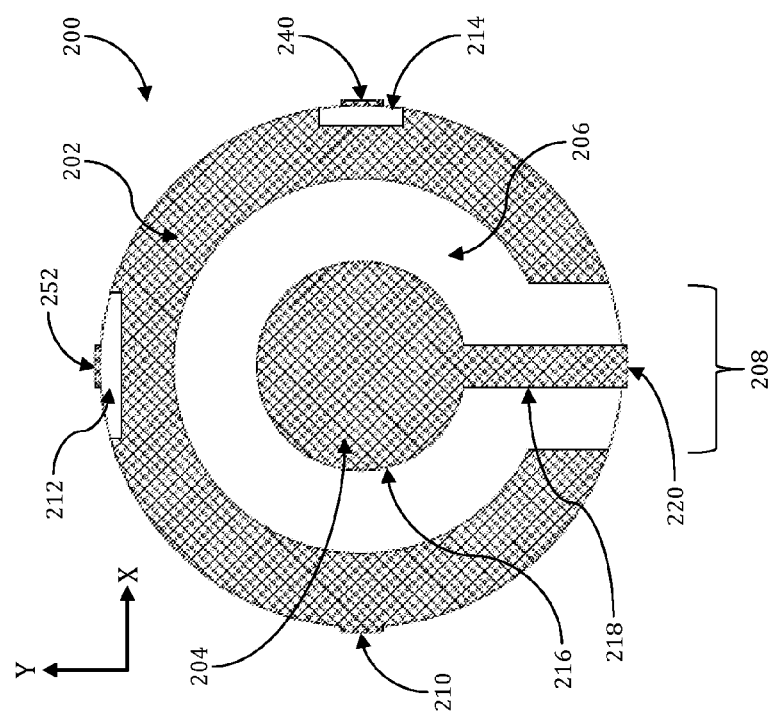

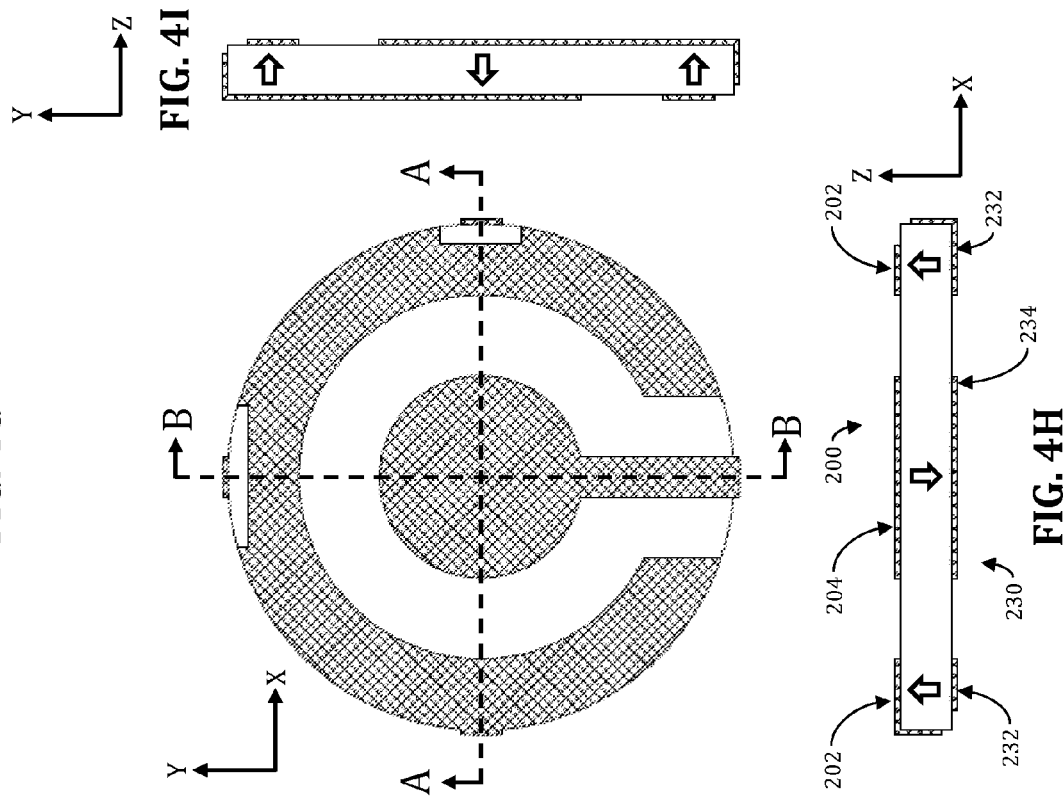

SLAT-CONSTRUCTED AUTONOMIC TRANSFORMERS

This application claims the benefit of U.S. provisional Application Ser. No. 61/543,698, filed Oct. 5, 2011, which is hereby incorporated by reference in its entirety.

I. STATEMENT REGARDING FEDERALLY SPONSORED RESEARCH

This invention was made with government support under Contract No. FA9453-11-C-0076 awarded by the United States Air Force. The government has certain rights in the invention.

II. FIELD OF THE INVENTION

The present application relates to autonomic transformers and methods for constructing the same.

III. BACKGROUND TO THE INVENTION

Single layer and multilayer Ceramic transformers offer a number of advantages over standard electromagnetic based transformers including ease of miniaturization and high galvanic isolation. However, impediments exist that have made single layer and multilayer ceramic transformers unattractive in applications that generally employ standard isolated magnetic DC/AC voltage level shift devices.

Ceramic transformers can be categorized into three types: Rosen type, thickness vibration type, and planar vibration-type, displayed in prior art FIG. 1a, FIG. 1b, and FIG. 2a. Among the three types, Rosen type transformers are most common as they traditionally provide the highest voltage gain and power density for DC-DC or AC-DC converter applications. However, several major challenges have prevented wider acceptance of ceramic transformers.

Although ceramic transformers are inherently very highly power dense devices, power handling and power throughput are distinct issues. Existing ceramic transformers are of high power density, but the voltage range in which they operate optimally is too high for typical modern electronics. The issue is not one of power density (ceramic transformers are typically capable of 40-50 W/cm3). The issue is that the power throughput supply voltage requirements necessary to achieve appropriate power throughput are higher than normally supplied by conventional applications and that such high supply voltage is likely to rapidly cause internal damage to the ceramic transformer.

It is believed that one of the underlying reasons for this lack of power throughput performance is a lack of ability to design or control by construction both the supply side impedance and the load side impedance of the existing ceramic transformers. To obtain improved power throughput requires both the supply side impedance and the load side impedance must be simultaneously addressed. Prior art ceramic transformer designs, including multilayer ceramic transformer designs, do not exhibit the ability to adjust both the input and the output impedance characteristics to control the power throughput. Accordingly, there is a need for a ceramic transformer design that can simultaneously enable impedance selectivity at both input and output through construction selection as to both provide a more agile application capability, a superior power throughput capability and a lower cost of manufacture. The invention provides for such capability.

Another challenge to wide implementation of existing ceramic transformers is that it is difficult to design ceramic transformers for efficient step-down voltage gain at higher power. For example, there are fundamental problems at present in attempting to employ known ceramic transformer devices for low impedance (high current/low voltage) applications for small electronics devices such as cell phones and iPod chargers and similar such converter or isolator applications. In many existing ceramic transformers, the voltage gain automatically increases as the output load decreases. This leads to a difficulty in that increasing power capability for such ceramic transformers directly leads to impedance mismatch at low impedance output electrical loading conditions. What is needed is a method to provide moderate to large step down ratios in a manner that maximizes mechanical coupling efficiencies and enables significant power throughput.

Still another challenge of the prior art is that known ceramic transformers tend to be "gain specific". Prior art ceramic transformers are generally either step-up type or, much more rarely, a step-down type of a small step-down ratio. A common approach to achieving step-down capability is simply to reverse the input and output connections. However, this approach leads to further limiting power throughput and a reduction in efficiency. What is needed is a method to provide both moderate and large power levels and step-down ratios in a single modular design that maximizes electrical power conversion efficiency and enables significant power throughput.

More recent developments in piezoelectric transformer technology, as exemplified in (a) Vo Viet et al, "Investigation of the Optimum Design for a 10 W Step-down 3-layer Piezoelectric Transformer," Journal of the Korean Physical Society, 58, No. 3, March 2011 and (b) Kim, Insung et al, "Ring-dot-shaped Multilayer Piezoelectric Step-down Transformers Using PZT-based Ceramics", Journal of the Korean Physical Society, Vol. 57, No. 4 (2010), have sought to use the advantage of unipoled transformer construction in multilayer designs, as disclosed in U.S. Pat. No. 5,278,471, as to enable step-down transform capability. FIG. 1a and FIG. 1b illustrate an exemplary representation of such a multilayer unipoled piezoelectric transformer. The device of FIG. 1a and FIG. 1b has certain design and performance limitations. Because the innermost electrode region 101, at the center of the ring or annulus areas 103, are electrically inaccessible all the individual 'central dot' layers which comprise region 107 must be uniformly poled in a common direction. This causes the central ring to act as a single piece of ceramic and though it is physically a multilayer construction it is electrically a single poled layer. Each additional layer, or increased thickness, reduces the capacitance of the center dot region thus increasing the impedance of the respective port of the transformer. This increase in output impedance then reduces the effectiveness of the device as a step-down transformer. Additionally, this restriction obviates the ability to selectively control the effective impedance as seen by the input side AC drive voltage which prevents enabling higher power throughput in many situations such as one-to-one or step-down transform ratio applications.

The configuration of FIG. 1a can add additional layers of either alternating or common poling direction interlace. However, irrespective of the number of layers and poling orientation selections, the prior art of FIG. 1a and FIG. 1b is further limited to operate either in Series-in/Parallel-out mode, Parallel-in/Series-Out mode, or Series-in/Series-out mode of electrical configuration. In particular, prior art exemplified by FIG. 1a and FIG. 1b precludes any feasible realization of a Parallel-in/Parallel-out, which creates the ability to create a low output and input impedance, operation, but it is precisely this configuration that is essential to larger voltage step-down applications of piezoelectric transformer constructions that exhibit high efficiencies and high power throughput.

The prior art as exemplified in FIG. 1a and FIG. 1b has another undesirable set of restrictions. The electrode design arrangement is not conducive to either low cost production or scalability in terms of voltage transformation or power level. Increasing or decreasing the number of layers in the design becomes a complicated modeling and redesign challenge. Additionally, no modular approach to layer fabrication or assembly can be applied.

FIG. 2a presents a planar mode single layer piezoelectric transformer in a toroidal form factor. Turning to FIG. 2b, the concept of a Parallel-in/Parallel-out mode operation is achieved utilizing a pair of devices of FIG. 2a, but is done so at the cost of physical separation the piezoelectric elements. Unavoidable variation in resonant frequency, no matter the tolerance of fabrication, will cause such a solution to perform at reduced efficiencies. The variation in resonant frequency between device 201 and device 203, in FIG. 2b, causes the need for a sacrifice to be made when driving the devices from a single source 205. Since the devices 201 and 203 will have two distinct resonant frequencies they can't be driven in parallel efficiently from a single frequency source 205. This problem becomes most pronounced when attempting to parallel multiple elements, as the mean variation in resonant frequency increases, the overall performance of the combined of devices will decrease. The present invention aims to eliminate this issue of variation in frequency by physically coupling the layers as a single mechanical structure. When fully mechanically coupled, the stack itself has a single resonant frequency, thus individual layers in the stack operate at this single resonant frequency, eliminating any reduction in performance from phase cancelation and off-resonant operation.

IV. SUMMARY OF THE INVENTION

In some embodiments the invention is directed to novel multilayer transformers and transformer elements. In other embodiments the invention is directed to novel methods for assembling multilayer transformers.

More particularly, in one embodiment, the invention is directed to a modular slat usable for building a multilayer transformer. The slat includes a dielectric structural element of substantially uniform planar thickness, which has first and second opposing faces and a sidewall. A first electrode assembly is overlayed on the first face. The first electrode assembly has an outer electrode disposed along an outer boundary of the first face and a discontinuous region. The outer electrode has first and second cutouts and the outer electrode also has an outer electrode tab extending along the sidewall from the first face towards the second face.

The first electrode assembly further includes an inner electrode disposed substantially concentric with the outer electrode. The inner electrode includes a central region and a leg extending from the central region to an edge of the first face. An inner electrode tab extends along the sidewall from the leg towards the second face. An insulation region is positioned between the first and second electrodes.

A second electrode assembly is overlayed on the second face of the slat and asymmetrically arranged relative to the first electrode assembly. The second electrode assembly has an outer electrode disposed along an outer boundary of the second face and a discontinuous region or discontinuity. The outer electrode includes first and second cutouts that are aligned with the inner and outer electrode tabs of the first electrode assembly. The outer electrode further includes a tab extending along the sidewall from the second face towards the first face where the tab is aligned with one of the first and second cutouts.

The second electrode assembly also has an inner electrode disposed substantially concentric with the outer electrode. The inner electrode has a central region and a leg extending from the central region to an edge of the second face and a tab extending along the sidewall from the leg towards the first face and aligned with the other of the first and second cutouts.

The second electrode assembly further includes an insulation region disposed between the first and second electrodes.

The invention further encompasses another embodiment of a modular slat usable for building multilayer transformers. In this embodiment, the modular slat includes a dielectric structural member of substantially uniform planar thickness, which has first and second opposing faces and a sidewall. A first electrode assembly is overlayed on the first face. The first electrode assembly has an outer electrode disposed along an outer boundary of the first face and a discontinuous region. The outer electrode has first and second cutouts and the outer electrode also has an outer electrode tab extending along the sidewall from the first face towards the second face.

The first electrode assembly further includes an inner electrode disposed substantially concentric with the outer electrode. The inner electrode includes a central region and a leg extending from the central region to an edge of the first face. An inner electrode tab extends along the sidewall from the leg towards the second face. An insulation region is positioned between the first and second electrodes.

A central electrode is disposed in the insulation region substantially concentric with the inner and outer electrodes. The central electrode includes at least a first leg extending to an edge of the first face and a central electrode tab extending along the sidewall from the first leg towards the second face.

A second electrode assembly is overlayed on the second face of the slat and asymmetrically arranged relative to the first electrode assembly. The second electrode assembly has an outer electrode disposed along an outer boundary of the second face and a discontinuous region or discontinuity. The outer electrode includes first and second cutouts that are aligned with the inner and outer electrode tabs of the first electrode assembly. The outer electrode further includes a tab extending along the sidewall from the second face towards the first face where the tab is aligned with one of the first and second cutouts.

The second electrode assembly also has an inner electrode disposed substantially concentric with the outer electrode. The inner electrode has a central region and a leg extending from the central region to an edge of the second face and a tab extending along the sidewall from the leg towards the first face and aligned with the other of the first and second cutouts.

The second electrode assembly further includes an insulation region disposed between the first and second electrodes. A central electrode is disposed in the insulation region substantially concentric with the inner and outer electrodes, the central electrode includes at least a first leg extending to an edge of the second face and a central electrode tab extending along the sidewall from the first leg towards the first face, the tab being in alignment with at least one of the cutouts of the outer electrode of the first face.

In accordance with another aspect of the invention, a novel multilayer ceramic core transformer element is claimed. The ceramic element includes a ceramic member of substantially uniform thickness, which has first and second opposing faces and a sidewall. A first electrode assembly is overlayed on the first face of the ceramic element. The first electrode assembly has at least two electrically isolated electrodes separated by a non-conducting region and a plurality of tabs extending along the sidewall of said ceramic member towards the second face.

A plurality of non-conductive tab receiving regions are disposed on the first face of the ceramic member, the tab receiving regions are free from electrodes and generally non-conductive.

A second electrode assembly is disposed on the second face of the ceramic member and asymmetrically positioned with respect to the first electrode assembly. The second electrode assembly has at least two electrically isolated electrodes separated by a non-conducting region. The second electrode assembly also has a plurality of tabs extending along the sidewall of said ceramic member towards the first face.

A plurality of non-conductive tab receiving regions are disposed on the second face of said ceramic member, where the tab receiving regions are free from electrodes and generally non-conductive. The non-conductive tab receiving regions of the second face are axially aligned with the plurality of tabs of the first electrode assembly and the non-conductive tab regions of the first face are axially aligned with the plurality of tabs of the second electrode assembly.

In still another embodiment, the invention is directed to a multilayer ceramic core transformer. The transformer includes a first ceramic member of substantially uniform thickness, which has first and second opposing faces and a sidewall. The ceramic member has a first electrode assembly disposed on its first face where the electrode assembly includes at least two electrically isolated electrodes separated by a non-conducting region. The first electrode assembly also has a plurality of tabs that extend along the sidewall of the ceramic member towards its second face.

A plurality of non-conductive tab receiving regions disposed on the first face of the ceramic member which are free from electrodes and generally non-conductive.

A second electrode assembly is disposed on the second face and positioned asymmetrically with respect to the first electrode assembly. The second electrode assembly has at least two electrically isolated electrodes separated by a non-conducting region and a plurality of tabs extending along the sidewall of the ceramic member towards its first face.

A plurality of non-conductive tab receiving regions are disposed on the second face of the first ceramic member and are axially aligned with the plurality of tabs of the first electrode assembly. The non-conductive tab regions of the first face are axially aligned with the plurality of tabs of the second electrode assembly.

A second ceramic member of substantially uniform thickness with first and second opposing faces and a sidewall is stacked with the first ceramic member. The second ceramic member has a first electrode assembly disposed on its first face, where the first electrode assembly has at least two electrically isolated electrodes separated by a non-conducting region and a plurality of tabs extending along the sidewall of the second ceramic member towards its second face.

A plurality of non-conductive tab receiving regions are disposed on the first face of the second ceramic member, where the tab receiving regions being free from electrodes and generally non-conductive.

A second electrode assembly disposed on the second face of the second ceramic element positioned asymmetrically with respect to the first electrode assembly of the second ceramic element. The second electrode assembly has at least two electrically isolated electrodes separated by a non-conducting region and a plurality of tabs extending along the sidewall of the second ceramic member towards its first face.

A plurality of non-conductive tab receiving regions are disposed on the second face of the second ceramic member, where the tab receiving regions are free from electrodes and generally non-conductive. The tab receiving regions of the second face are axially aligned with the plurality of tabs of the first electrode assembly and the non-conductive tab regions of the first face are axially aligned with the plurality of tabs of the second electrode assembly.

In keeping with the invention, the first ceramic member is stacked with the second ceramic member such that the second face of the first ceramic member is substantially parallel with the first face of the second ceramic member and at least one of the plurality of tabs of the second electrode assembly of the first ceramic element is axially aligned with at least one of the plurality of tabs of the first electrode assembly of the second ceramic element.

In still another embodiment, the invention is directed to a method of constructing a multilayer ceramic core transformer using transformer elements. In accordance with the inventive method, first and second ceramic elements are selected. Each ceramic element comprises a ceramic member of substantially uniform thickness, with first and second opposing faces and a sidewall. Each ceramic element has a first electrode assembly disposed on its first face and a second electrode assembly disposed on its second face. The first electrode assembly includes at least two electrically isolated electrodes separated by a non-conducting region and a plurality of tabs extending along the sidewall of the ceramic member towards the second face.

The ceramic member also has a plurality of non-conductive tab receiving regions disposed on its first face. The tab receiving regions are free from electrodes and generally non-conducting.

The second electrode assembly is disposed on the second face and positioned asymmetrically with respect to the first electrode assembly. The second electrode assembly has at least two electrically isolated electrodes separated by a non-conducting region and a plurality of tabs extending along the sidewall of said ceramic member towards its first face. A plurality of non-conductive tab receiving regions are disposed on the second face of the ceramic member. The tab receiving regions are free from electrodes and generally non-conductive. However, the non-conductive tab receiving regions of the second face are axially aligned with the plurality of tabs of the first electrode assembly and the non-conductive tab regions of the first face are axially aligned with the plurality of tabs of the second electrode assembly.

In keeping with the inventive method, the first and second ceramic elements are arranged in a stacked configuration such that the electrode assembly of the second face of the first ceramic element is coincident with the electrode assembly of first face of the second ceramic element. The electrodes of the second face of the first ceramic element are bonded to opposing electrodes of the first face of the second ceramic element. In some embodiments they may be electrically conductively bonded. At least one of the tabs of the first electrode assembly of the first ceramic element is electrically connected to at least one of the tabs of the second electrode assembly of the second ceramic element to form an input or an output.

V. BRIEF DESCRIPTION OF THE DRAWINGS

FIG. 1A illustrates a prior piezoelectric transformer.
FIG. 1B depicts a cutaway view of the piezoelectric transformer of FIG. 1a taken along line BB'.
FIG. 2A shows a prior piezoelectric transformer.
FIG. 2B depicts an embodiment of the piezoelectric transformer of FIG. 2a.

FIG. 3A is a top view of a modular slat in accordance with the invention

FIG. 3B shows a bottom view of the modular slat of FIG. 3a.

FIG. 3G shows a top view of a modular slat in accordance with an embodiment of the invention.

FIG. 3H depicts a cutaway view of the modular slat of FIG. 3G along line AA'.

FIG. 3I illustrates a cutaway view of the modular slat of FIG. 3G along line BB'

FIG. 3J shows a top view of a modular slat in accordance with another embodiment of the invention.

FIG. 3K depicts a cutaway view of the modular slat of FIG. 3J along line AA'.

FIG. 3L shows a cutaway view of the modular slat of FIG. 3J along line BB'.

FIG. 4A illustrates a top view of a modular slat in accordance with still another embodiment of the invention.

FIG. 4B shows a bottom view of the modular slat of FIG. 4A.

FIG. 4G shows a top view of a modular slat in accordance with still another embodiment of the invention.

FIG. 4H illustrates a cutaway view of the modular slat of FIG. 4G along line AA'.

FIG. 4I depicts a cutaway view of the modular slat of FIG. 4G along line BB'.

VI. DESCRIPTION OF THE EMBODIMENTS OF THE INVENTION

Figure 1B:
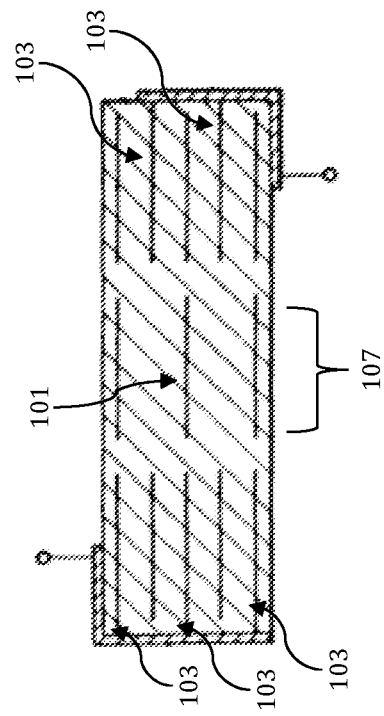
Figure 1A:
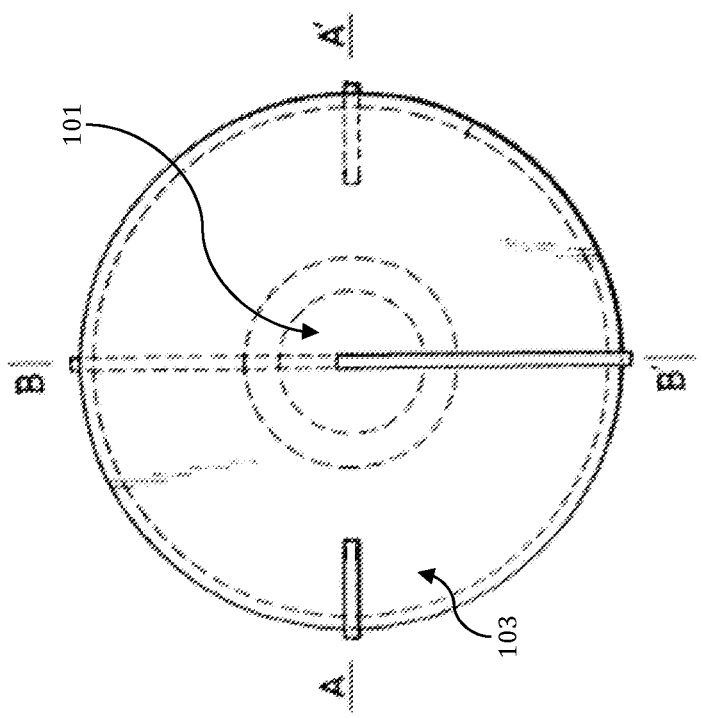
Figure 2A:
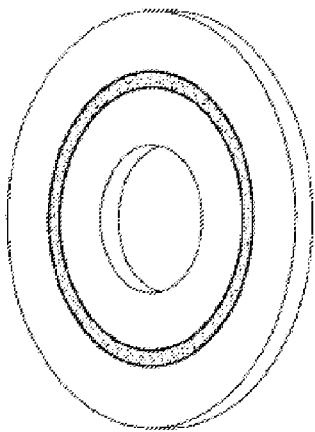
Figure 2B:
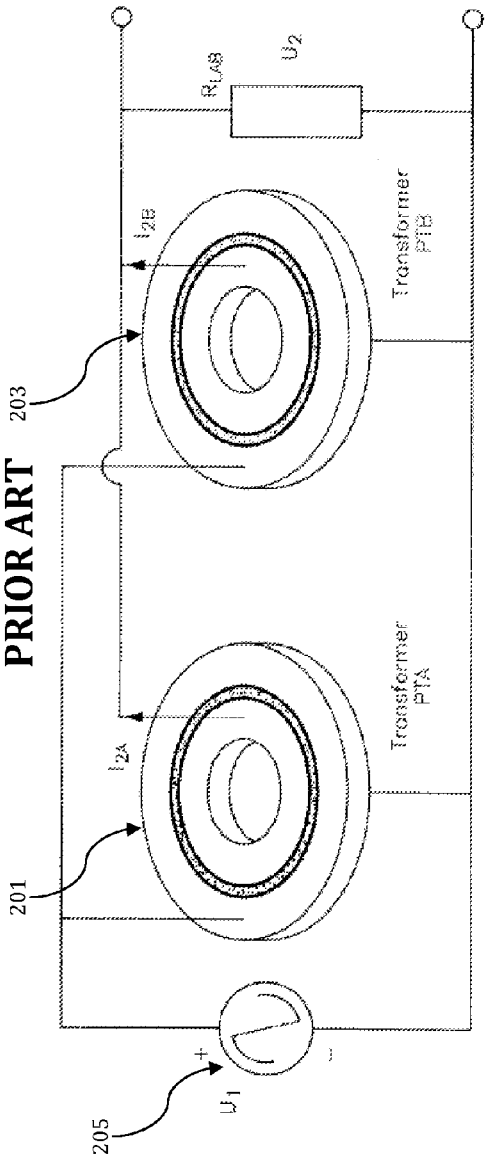

The invention is generally directed to modular ceramic elements generally used in the construction of ceramic transformers and novel embodiments of ceramic transformers themselves. Ceramic elements in accordance with the invention comprise ceramic transformer core that is a voltage transformer constructed from one or more "slats" of common planar shape; a "slat" being a uniformly thick dielectric ceramic that is sufficiently symmetric to allow resonant vibration without introduction of significant higher order harmonics and whose first and second faces are provided with an electrode pattern. Dependent upon the final transformer construction requirements, the respective electrode patterns on the first and second faces of a slat can be disposed both symmetrically and non-symmetrically. Each such slat that comprises a ceramic transformer core can be poled either uniformly or non-uniformly as dependent upon the transformer requirements.

Suitable planar geometries can include discs, annuli, or substantially flat squares where an individual slat is normally manufactured from material that is capable of providing both a direct effect of mechanical to electrical coupling and converse electrical to mechanical effect. Such materials include, but are not limited to, single crystal, piezoelectric ceramic, flexoelectric, or relaxor ferroelectric materials.

Ceramic Element "Slats"

In accordance with the invention, a plurality of different types of modular, reconfigurable ceramic elements or slats are disclosed that, taken individually or in combination, may form step up and/or step down ceramic transformers.

Type I-III Ceramic Elements

Turning to specific embodiments of the invention, a Type I modular ceramic element includes a ceramic core 70 that is preferably non-symmetrically electroded on its top surface and bottom surface. As illustrated in FIG. 3A, the top surface 1 incorporates an electrode pattern that provides for three physically separated electrodes 3, 4, and 5 that are separated by insulation regions 6 and 7 which may be bare non-electroded material or interposed non-conductive material such as urethane based epoxy, electronics potting material, or simply an air gap. Electrode 3 includes a band of electrode material that extends along the outer boundary of the top surface 1 of the ceramic core 70 and includes a discontinuity 10. Electrode 3 further includes a tab 18 extending downward in the direction of the negative z-axis and abutting ceramic core 70. In some embodiments, tab 18 extends along only a portion of sidewall 14 and does not reach the bottom surface 30 of ceramic core 70. Electrode 3 includes cutouts or tab receiving regions 8 and 9 which in some embodiments may be filled in with non-conductive material. As illustrated, cutout 8 is positioned 90° from tab 18. Cutout 9 is disposed about 90° from cutout 8 and about 180° from tab 18. The tabs and cutouts are so positioned to align with respective tabs and cutouts from the bottom surface 30 to facilitate interconnection of multiple modular ceramic elements.

Figure 3F:
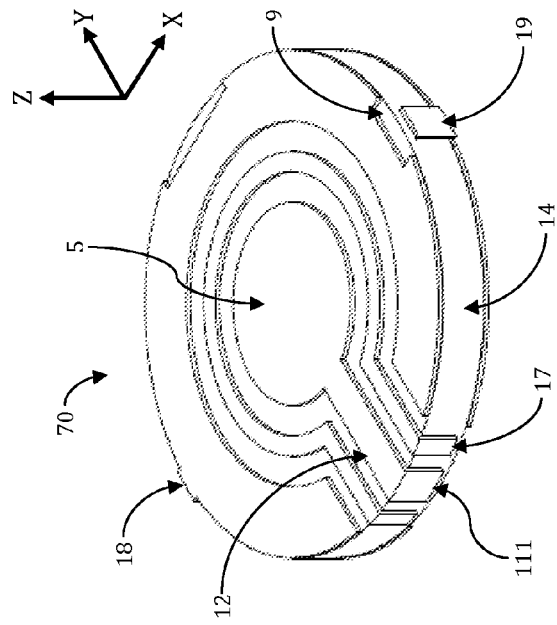
FIG. 3F illustrates a perspective view of a modular slat in accordance with an embodiment of the invention.

Electrode 5 is substantially concentric with electrode 3 and includes a central region 11 having a leg 12 extending to the outer radius/edge of ceramic core 70 through discontinuity 10. To provide a connection mechanism for electrode 5, tab 111 extends perpendicularly from the end of leg 12 and abuts sidewall 14 of ceramic core 70. In some embodiments, tab 111 extends along only a portion of sidewall 14 and does not reach the bottom surface 30, as best shown in FIG. 3F. In other embodiments, tab 111 extends along sidewall 14 to the bottom surface 30.

Electrode 4 is disposed between electrode 3 and 5 and includes a band that traces the outer edge of central region 11 and includes first and second legs 15 and 16 that extend to the edge of ceramic core 70 through discontinuity 10. To provide a connection mechanism for electrode 4, at least one of first and second legs 15 and 16 includes a tab 17 that extends from the end of at least one of legs 15 and 16, preferably perpendicularly, along the sidewall 14 of ceramic core 70. In some embodiments, tab 17 extends along only a portion of sidewall 14 and does not reach the bottom surface 30 as best shown in FIG. 3F.

Insulation region 6 electrically isolates electrode regions 4 and 5 and insulation region 7 electrically isolates electrode regions 3 and 4.

Turning to FIG. 3B, it depicts bottom surface 30 which incorporates an electrode pattern that provides for three physically separated electrodes 46, 47, and 48 that are separated by insulation regions 41 and 42 which may be bare non-electroded material or interposed non-conductive material. Electrode 46 includes a band of electrode material that extends along the outer boundary of the bottom surface 30 of ceramic core 70 and includes a discontinuity 34. The discontinuity 34 of electrode 46 is offset from the discontinuity 10 of electrode 3 by about 180°. Electrode 46 further includes a tab 19 that is axially aligned with cutout 9 and extends upward in the direction of the positive z-axis from electrode 46 along sidewall 14 of ceramic core 70 towards cutout 9. In some embodiments, tab 19 extends along only a portion of sidewall 14 and does not reach the top surface 1 of ceramic core 70. Electrode 46 includes cutouts 43 and 44 which in some embodiments may be filled in with nonconductive material. As illustrated, cutout 44 is positioned about 90° from tab 19. While cut out 43 is disposed about 90° from cutout 44 and about 180° from tab 19.

Figure 3E:
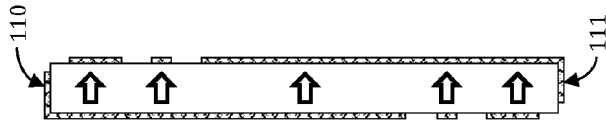
FIG. 3E depicts a cutaway view of the modular slat of FIG. 3C along line BB'.

Electrode 48 is substantially concentric with electrode 46 and includes a central region 36 having a leg 38 extending to the outer radius/edge of ceramic core 70 through discontinuity 34. To provide a connection mechanism for electrode 48, tab 110 is axially aligned with cutout region 8 and extends perpendicularly from the end of leg 38 towards cut out region 8 and abuts sidewall 14 of ceramic core 70. In some embodiments, tab 110 extends along only a portion of sidewall 14 and does not reach top surface 1 as best shown in FIG. 3E.

Electrode 47 is disposed between electrode 46 and 48 and includes a band that traces the outer edge of central region 36 and includes first and second legs 50 and 51 that extend to the edge of ceramic core 70 through discontinuity 34. To provide a connection mechanism for electrode 47, at least one of first and second legs 50 and 51 includes a tab 105 that extends from the end of the at least one of legs 50 and 51, preferably perpendicularly, along the sidewall 14 of ceramic core 70. In some embodiments, tab 105 extends along only a portion of sidewall 14 and does not reach top surface 1.

Insulation region 41 electrically isolates electrodes 47 and 48 and insulation region 42 electrically isolates electrodes 46 and 47.

Figure 3C:
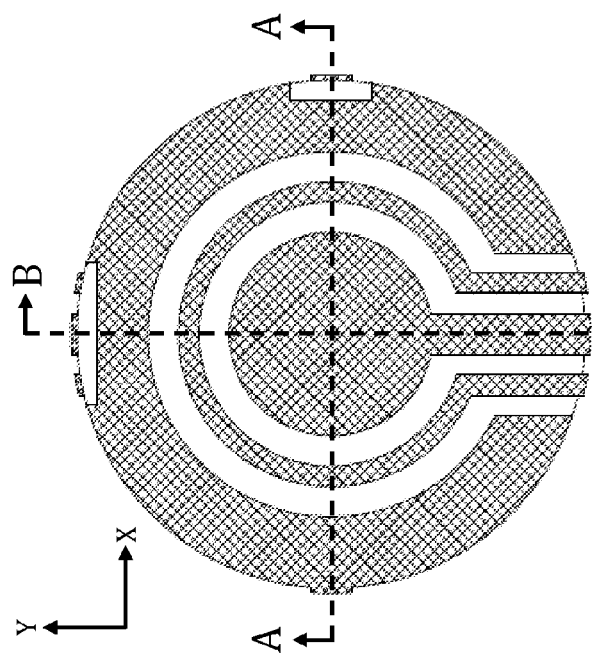
FIG. 3C illustrates a top view of a modular slat in accordance with an embodiment of the invention.
Figure 3D:
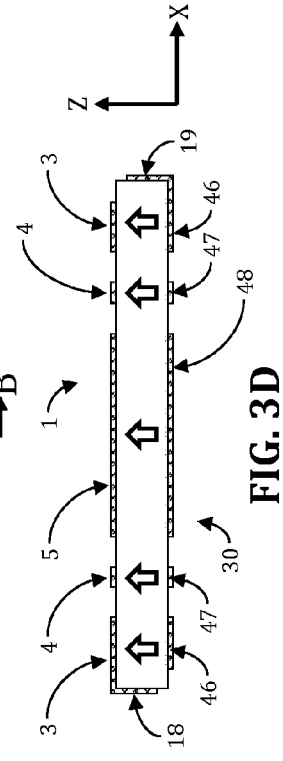
FIG. 3D depicts a cutaway view of the modular slat of FIG. 3C along line AA'.

In accordance with an aspect of the invention, ceramic core 70 may be poled to create capacitive regions between pairs of non-symmetric top and bottom electrodes. In one embodiment, as illustrated in FIGS. 3C, 3D and 3E, ceramic core 70 is uniformly poled in the positive z-axis direction across the thickness of ceramic core 70 as shown by the arrows. This uniform poling creates capacitive regions between pairs of (non-symmetric) top and bottom electrodes 48 and 5, 47 and 4, and 46 and 3.

In still another embodiment, sometimes referred to as a Type II ceramic element, ceramic core 70 is non-uniformly transversely poled in both the positive and negative z-axis direction across the thickness of ceramic core 70. As shown in FIGS. 3G, 3H and I, the poling of electrode pairs 3 and 46 and 4 and 47 is taken in the positive z-axis direction from bottom surface 30 to top surface 1. The poling of electrode pair 5 and 48 is taken in the negative z-axis from top surface 1 to bottom surface 30.

In yet another embodiment, as illustrated in FIGS. 3J, 3K and 3L, sometimes referred to as a Type III ceramic element, ceramic core 70 is uniformly poled in the negative z-axis direction across the thickness of ceramic core 70 as shown by the arrows. This uniform poling creates capacitive regions between pairs of (non-symmetric) top and the bottom electrodes 48 and 5, 47 and 4, and 46 and 3.

Type IV, V and VI Ceramic Elements

In accordance with a further embodiment, a ceramic element sometimes referred to as a Type IV ceramic element is described. As illustrated in FIG. 4A, the top surface 200 of ceramic core 270 incorporates an electrode pattern that provides for two physically separated electrodes 202 and 204 that are separated by an insulation region 206 which may be bare non-electroded material or interposed non-conductive material. Electrode 202 includes a band of electrode material that extends along the outer boundary of the top surface 200 of the ceramic core 270 and includes a discontinuity 208. Electrode 202 further includes a tab 210 extending downward in the direction of the negative z-axis and abutting ceramic core 270. In some embodiments, tab 210 extends along only a portion of sidewall 242 and does not reach the bottom surface 230 of ceramic core 270. Electrode 202 includes cutouts 212 and 214 which in some embodiments may be filled in with non-conductive material. As illustrated, cutout 212 is positioned about 90° from tab 210. Cut out 214 is disposed about 90° from cutout 212 and about 180° from tab 210. The tabs and cutouts are so positioned to align with respective tabs and cutouts from the bottom surface to facilitate interconnection of multiple modular ceramic elements.

Figures 4C, 4E, 4F:
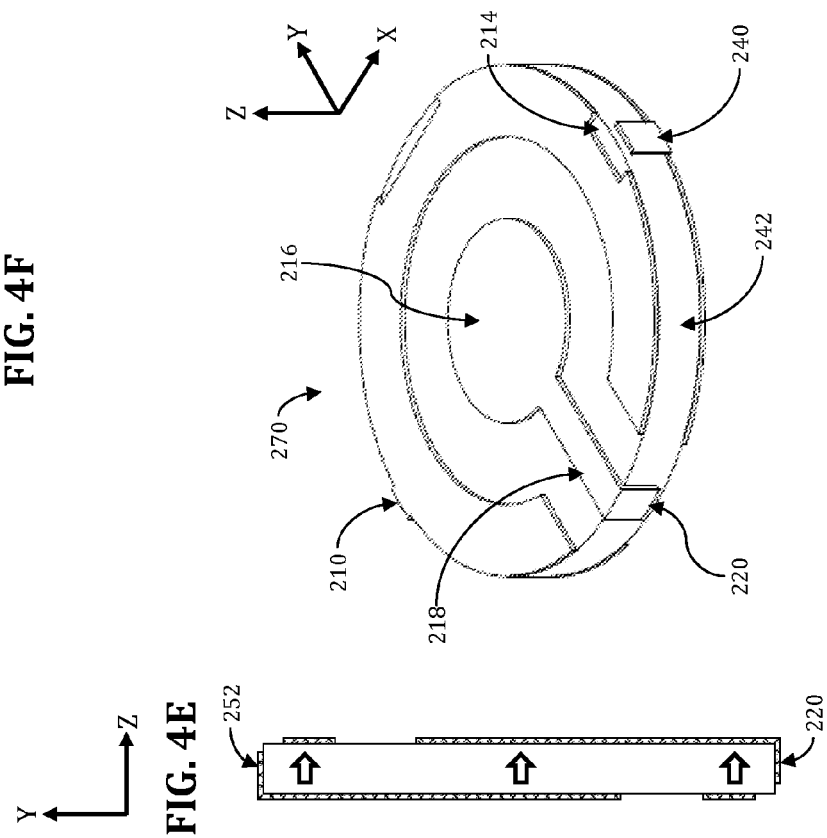
FIG. 4C depicts a top view of a modular slot according to yet another embodiment of the invention.
FIG. 4E shows a cutaway view of the modular slat of FIG. 4C along line BB'.
FIG. 4F illustrates a perspective view of a modular slat in accordance with an embodiment of the invention.
Figure 4D:
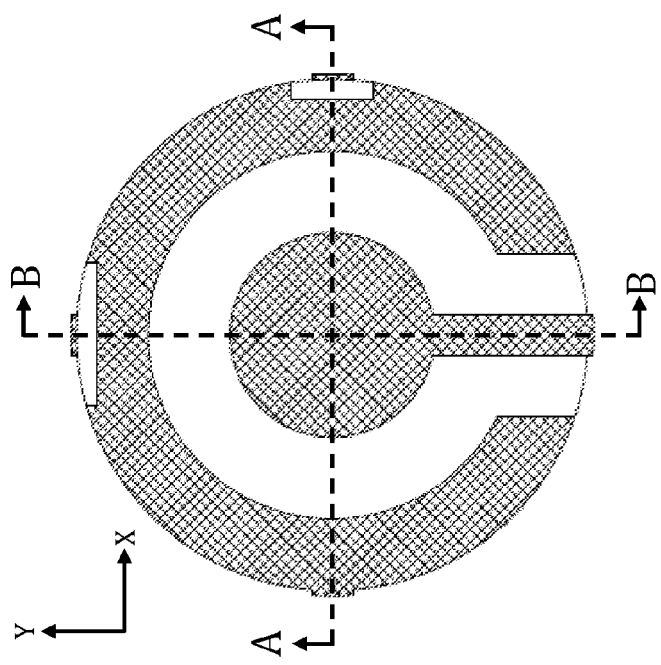
FIG. 4D depicts a cutaway view of the modular slat of FIG. 4C along line AA'.

Electrode 204 is substantially concentric with electrode 202 and includes a central region 216 having a leg 218 extending to the outer radius/edge of ceramic core 270 through discontinuity 208. To provide a connection mechanism for electrode 204, tab 220 extends perpendicularly from the end of leg 12 and abuts the sidewall 242 of ceramic core 270 as illustrated in FIG. 4D. In some embodiments, tab 220 extends along only a portion of the sidewall and does not reach the bottom surface 230 of ceramic core 270.

Insulation region 206 electrically isolates electrodes 202 and 204 from one another.

Turning to FIG. 4B, it depicts bottom surface 230 which incorporates an electrode pattern that provides for two physically separated electrodes 232 and 234 that are separated by an insulation region 236 which may be bare non-electroded material or interposed non-conductive material. Electrode 232 includes a band of electrode material that extends along the outer boundary of the bottom surface 230 of ceramic core 270 and includes a discontinuity 238. The discontinuity 238 of electrode 232 is offset from the discontinuity 208 of electrode 202 by about 180°. Electrode 232 further includes a tab 240 that is axially aligned with cut out 214 and extends upward, in the direction of the positive z-axis, from electrode 232 along sidewall 242 of ceramic core 270 towards cutout 214. In some embodiments, tab 240 extends along only a portion of sidewall 242 and does not reach the top surface 200 of ceramic core 270. Electrode 232 includes cutouts 244 and 246 which in some embodiments may be filled in with non-conductive material. As illustrated, cutout 244 is positioned about 90° from tab 240. While cutout 246 is disposed about 90° from cutout 244 and about 180° from tab 240.

Electrode 234 is substantially concentric with electrode 232 and includes a central region 248 having a leg 250 extending to the outer radius/edge of ceramic core 270 through discontinuity 238. To provide a connection mechanism for electrode 234, tab 252 is axially aligned with cutout region 212 and extends perpendicularly, in the direction of the positive z-axis, from the end of leg 250 towards cutout 212 and abuts sidewall 242 of ceramic core 270. In some embodiments, tab 252 extends along only a portion of sidewall 242 and does not reach top surface 200.

Insulation region 236 electrically isolates electrodes 232 and 234 from one another.

Likewise, tab 210 is axially aligned with cutout region 246 and extends perpendicularly, in the direction of the negative z-axis, from electrode 202 towards cut out region 246 and abuts sidewall 242 of ceramic core 270. In some embodiments, tab 210 extends along only a portion of sidewall 242 and does not reach top surface 230.

In accordance with an aspect of the invention, ceramic core 270 may be poled to create capacitive regions between pairs of non-symmetric top and bottom electrodes. In one embodiment, as illustrated in FIGS. 4C, 4D and 4E, ceramic core 270 is uniformly poled in the positive z-axis direction across the thickness of ceramic core 270 as shown by the arrows. This uniform poling creates capacitive regions between pairs of (non-symmetric) top and bottom electrodes 202 and 232 and 204 and 234.

In another embodiment, sometimes referred to as a Type V ceramic element, ceramic core 270 is non-uniformly transversely poled in both the positive and negative z-axis direction across the thickness of ceramic core 270. As shown in FIGS. 4G, 4H and 4I, the poling of electrode pairs 202 and 232 is taken in the positive z-axis direction from bottom surface 230 to top surface 200. The poling of electrode pair 204 and 234 is taken in the negative z-axis direction from top surface 200 to bottom surface 230.

Figure 4J:
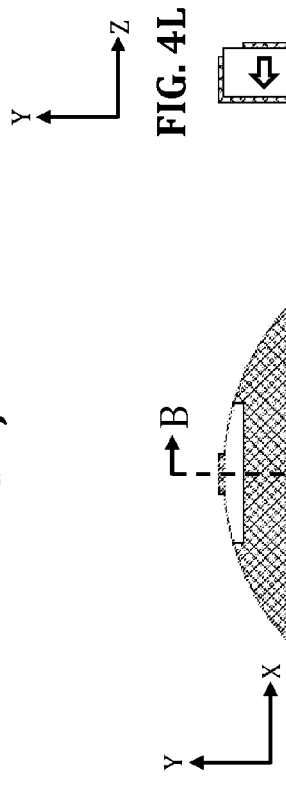
FIG. 4J shows a top view of a modular slat in accordance with still a further embodiment of the invention.
Figure 4K:
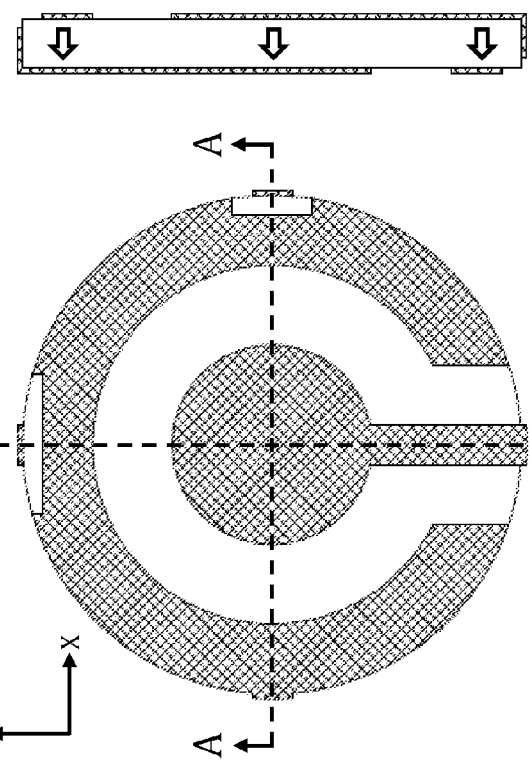
FIG. 4K depicts a cutaway view of the modular slat of FIG. 4J along line AA'.
Figure 4L:
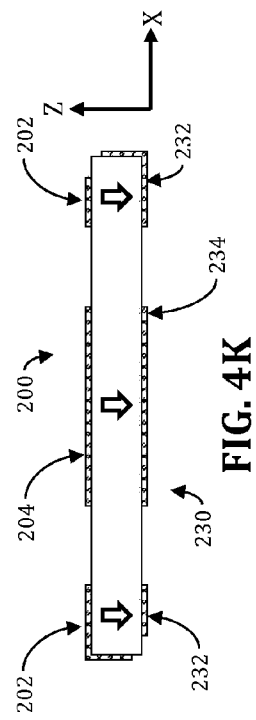
FIG. 4L shows a cutaway view of the modular slat of FIG. 4J along line BB'.

In yet another embodiment, as illustrated in FIGS. 4J, 4K and 4L, sometimes referred to as a Type VI ceramic element, ceramic core 270 is uniformly poled in the negative z-axis direction across the thickness of ceramic core 270 as shown by the arrows. This uniform poling creates capacitive regions between pairs of (non-symmetric) top and the bottom electrodes 202 and 232, and 204 and 234, respectively.

It should be noted that the Type I through Type III ceramic elements are comparable, and effectively cross compatible, with the Type IV through Type VI elements, respectively. The Type I through Type III elements contain an auxiliary output electrode pair, typically utilized for autonomic feedback or an additional output. The Type IV through Type VI elements contain no auxiliary output electrode pair, but are effectively comparable to the Type I through Type III. For example, a Type I ceramic element utilized in the two layer parallel input/parallel output transformer of FIG. 5, could be replaced with a Type IV ceramic element. The resultant stacked transformer will sacrifice its auxiliary or autonomic output, but remain a functioning embodiment of the invention.

In keeping with an aspect of the invention, each of the above described types of ceramic elements may be modularly stacked in various combinations to form autonomic transformers. Additionally, each of the described ceramic elements may be implemented as either autonomic or general purpose piezoelectric transformers in a standalone configuration. Exemplary combinations of such transformers are depicted in the figures as described below.

Autonomic Transformer Embodiments
Parallel In/Parallel Out—Two Stack

Figure 5:
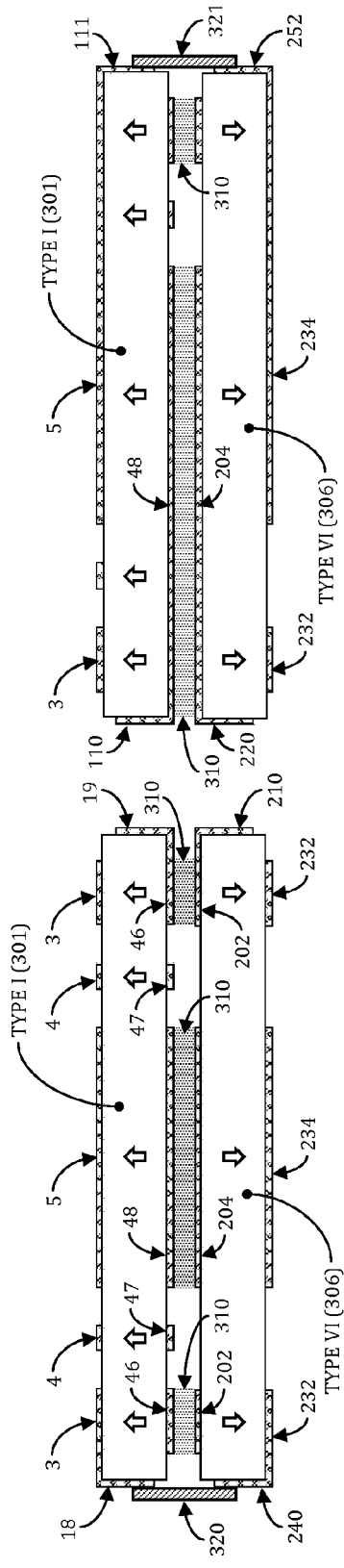
FIG. 5 illustrates an embodiment of a parallel in/parallel out two layer autonomic transformer.
Figure 5:
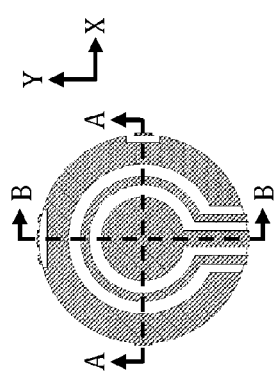
Figure 5:
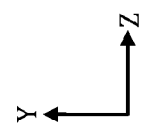

Turning to FIG. 5, it depicts an embodiment of the invention comprising a two-layer parallel input/parallel output autonomic transformer. A Type VI ceramic element 306 is arranged beneath a Type I ceramic element 301 such that the top surface 200 of ceramic element 306 is parallel with the bottom surface 30 of Type I ceramic element 301. Additionally, the Type VI ceramic element 306 is arranged such that its electrode tab 210 is axially aligned with the electrode tab 19 of Type I ceramic element 301. This alignment ensures the electrode pattern of the top surface 200 of Type VI ceramic element 306 is coincident with the electrode pattern of bottom surface 30 of Type I ceramic element 301. An electrically conductive adhesive 310 is used to bond the ceramic elements 301 and 306 across the coincident electrode boundaries, such that coincident electrode pairs 202 and 46, 48 and 204, and 46 and 202 are connected electrically. In some embodiments, the electrically conductive adhesive 310 may be anisotropically conductive in the z-axis to prevent electrical connection between coincident electrode pairs during manufacture. Additionally, in embodiments using anisotropic adhesive, the entire planar surface between the ceramic elements may be covered with said anisotropic adhesive, creating a persistent continuous layer of material between the elements.

In this embodiment, electrodes 3 and 232 become the first input terminal to the transformer. Electrodes 46 and 202, now electrically connected by the conductive adhesive 310, become the second input terminal to the transformer. An electrically conductive material 320, typically solder, can be used to electrically connect tabs 18 and 240 together, thus providing a simple method for electrically connecting electrodes 3 and 232. This configuration results in an electrically parallel connection of the input side capacitive regions of ceramic elements 301 and 306.

The first output terminal includes electrodes 5 and 234. The second output terminal includes electrodes 48 and 204, now electrically connected by conductive adhesive 310. An electrically conductive material 321, typically solder, can be used to electrically connect tabs 111 and 252 together, thus providing a simple method for electrically connecting electrodes 5 and 234. This configuration results in an electrically parallel connection of the output side capacitive regions of ceramic elements 301 and 306.

Electrode 4 and 47 of Type I ceramic element 301 become the first and second terminals for the autonomic auxiliary output of the transformer, respectively.

The parallel input/parallel output configuration of ceramic elements in this embodiment will typically result in a step-down or near unity voltage transform ratio. The parallel input configuration will result in an increased input capacitance when compared to the capacitance of a single element. When operated at its static resonant frequency, an increase in input capacitance results in decreased input impedance. Likewise, the parallel output configuration effectively increases the output capacitance, thus decreasing the output impedance.

Parallel In/Serial Out—Two Stack

Figure 6:
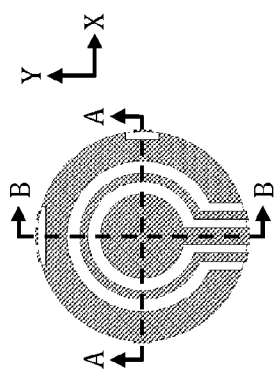
FIG. 6 depicts an embodiment of a parallel input/serial output two layer autonomic transformer.
Figure 6:
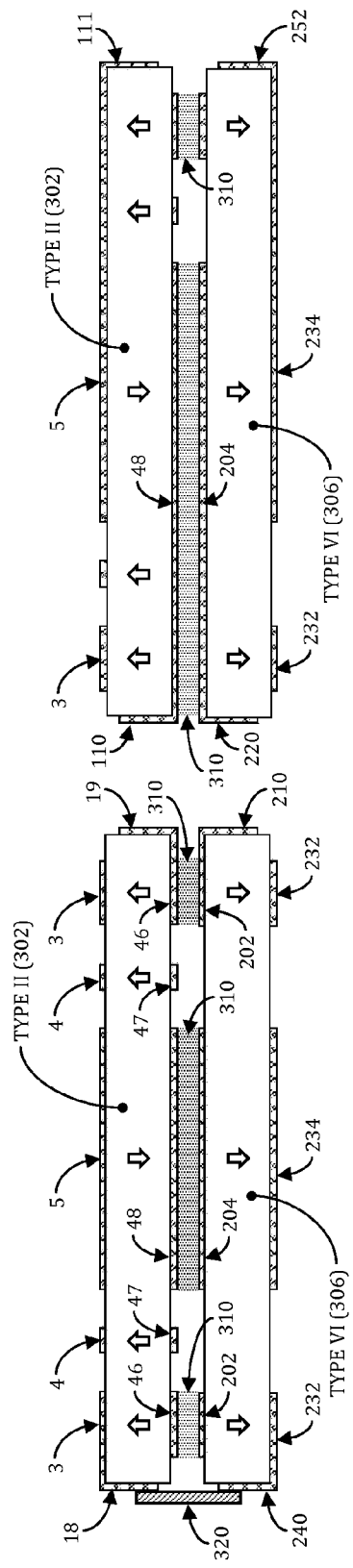

Turning to FIG. 6, it depicts an embodiment of the invention demonstrating a two-layer parallel input/serial output autonomic transformer. In this embodiment a Type II ceramic element 302 and a Type VI ceramic element 306 are bonded in a manner as described for the two-layer parallel in/parallel out case, depicted in FIG. 5, where the Type I ceramic element 301, of FIG. 5, is replaced with a Type II ceramic element, as depicted in FIG. 6.

Electrodes 3 and 232 become the first input terminal to the transformer. Electrodes 46 and 202, again electrically connected by the conductive adhesive 310, become the second input terminal to the transformer. An electrically conductive material 320, typically solder, can be used to electrically connect tabs 18 and 240 together, thus providing a simple method for electrically connecting electrodes 3 and 232. This configuration results in an electrically parallel connection of the input side capacitive regions of ceramic elements 301 and 306.

In this embodiment, the first output terminal is taken from electrode 234. The second output terminal is taken from electrode 5. Additionally, tab 111 of electrode 5 and tab 252 of electrode 234 are left electrically isolated. This configuration results in an electrically serial connection of the output side capacitive regions of ceramic elements 301 and 306.

Electrode 4 and 47 of Type I ceramic element 301 become the first and second terminals for the autonomic auxiliary output of the transformer, respectively.

The parallel input/serial output configuration of ceramic elements in this embodiment will typically result in a step-up voltage transform ratio. The parallel input configuration will result in an increased input capacitance when compared to the capacitance of a single element. When operated at its static resonant frequency, an increase in input capacitance results in decreased input impedance. Conversely, the serial output configuration effectively decreases the output capacitance, thus increasing the output impedance.

Serial In/Parallel Out—Two Stack

Figure 7:
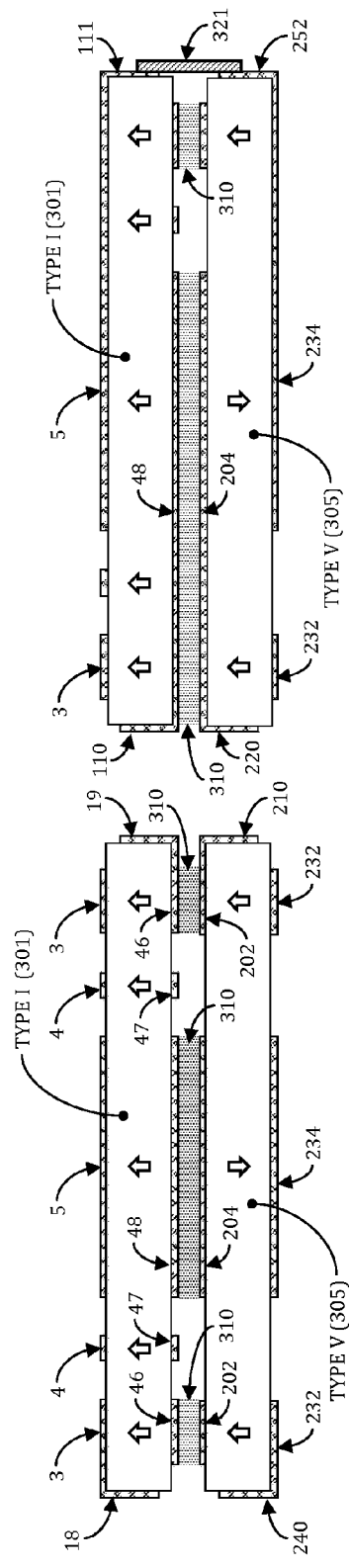
FIG. 7 shows an embodiment of a serial input/parallel output two layer autonomic transformer.
Figure 7:
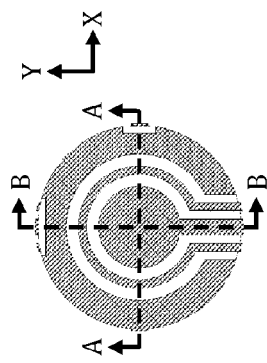
Figure 7:
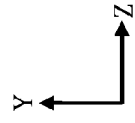

Turning to FIG. 7, it depicts an embodiment of the invention demonstrating a two-layer serial input/parallel output autonomic transformer. In this embodiment a Type I ceramic element 301 and a Type V ceramic element 305 are bonded in a manner as described for the two-layer parallel in/parallel out case, depicted in FIG. 5, where the Type VI ceramic element 306, of FIG. 5, is replaced with a Type V ceramic element 305, as depicted in FIG. 7.

In this embodiment, the first input terminal is taken from electrode 3. The second input terminal is taken from electrode 232. Additionally, tab 18 of electrode 3 and tab 240 of electrode 232 are left electrically isolated. This configuration results in an electrically serial connection of the input side capacitive regions of ceramic elements 301 and 305.

The first output terminal includes electrodes 5 and 234. The second output terminal includes electrodes 48 and 204, now electrically connected by conductive adhesive 310. An electrically conductive material 321, typically solder, can be used to electrically connect tabs 111 and 252 together, thus providing a simple method for electrically connecting electrodes 5 and 234. This configuration results in an electrically parallel connection of the output side capacitive regions of ceramic elements 301 and 305.

Electrode 4 and 47 of Type I ceramic element 301 become the first and second terminals for the autonomic auxiliary output of the transformer, respectively.

The serial input/parallel output configuration of ceramic elements in this embodiment will typically result in a step-down voltage transform ratio. The serial input configuration will result in a decreased input capacitance when compared to that of a single element. When operated at its static resonant frequency, a decrease in input capacitance results in increased input impedance. Conversely, the parallel output configuration effectively increases the output capacitance, thus decreasing the output impedance.

Parallel In/Parallel Out—Four Stack

Figure 8:
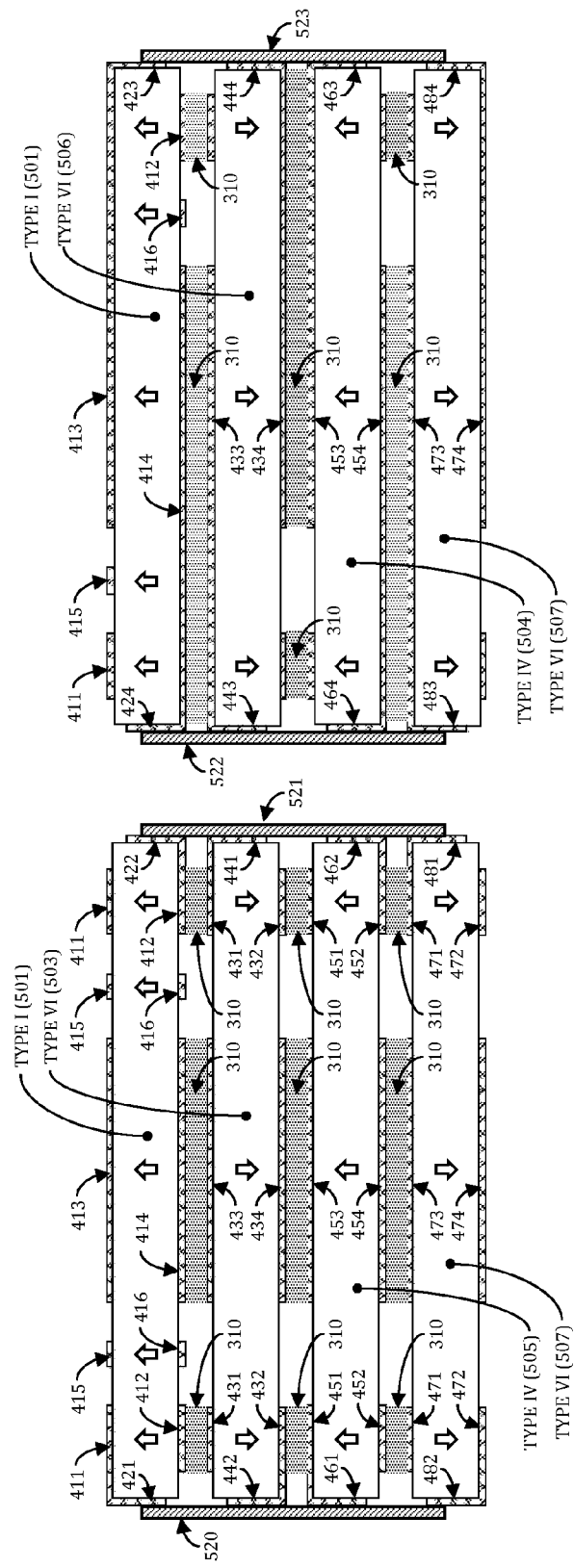
FIG. 8 shows an embodiment of a parallel input/parallel output four layer autonomic transformer.

Turning to FIG. 8, it depicts an embodiment of the invention demonstrating a four-layer parallel input/parallel output autonomic transformer. The Type VI ceramic element 503 is concentrically arranged beneath ceramic element 501, with its top surface parallel to the bottom surface of ceramic element 501, such that its electrode tab 441 is axially aligned with the electrode tab 422 of ceramic element 501. The Type IV ceramic element 505 is concentrically arranged beneath ceramic element 503, with its top surface parallel to the bottom surface of ceramic element 503, such that its electrode tab 462 is axially aligned with the electrode tab 441 of ceramic element 503. Likewise, the second Type VI ceramic element 507 is concentrically arranged beneath ceramic element 505, with its top surface parallel to the bottom surface of ceramic element 505, such that its electrode tab 481 is axially aligned with the electrode tab 462 of ceramic element 505.

An electrically conductive adhesive 310 is used to bond ceramic elements 501, 503, 505 and 507 across their respective coincident electrode boundaries, such that coincident electrode pairs 412 and 431, 414 and 433, 432 and 451, 434 and 453, 452 and 471, and 454 and 473 are connected electrically. In some embodiments, the electrically conductive adhesive 310 may be anisotropically conductive in the z-axis to prevent electrical connection between coincident electrode pairs during manufacture. Additionally, in embodiments using anisotropic adhesive, the entire planar surface between the ceramic elements may be covered with said anisotropic adhesive, creating a persistent continuous layer of material between the elements.

In this embodiment, electrodes 411, 432, 451 and 472 become the first input terminal to the transformer. Electrodes 412, 431, 452 and 471 become the second input terminal to the transformer. An electrically conductive material 520 can be used to electrically connect tabs 421, 442, 461 and 482, thus providing a simple method for electrically connecting the first input terminal electrodes. Likewise, an electrically conductive material 521 can be used to electrically connect tabs 422, 441, 462 and 481, thus providing a simple method for electrically connecting the second input terminal electrodes. This configuration results in an electrically parallel connection of the input side capacitive regions of ceramic elements 501, 503, 505 and 507.

The first output terminal includes electrodes 413, 434, 453, and 474. The second output terminal includes electrodes 414, 433, 454 and 473. An electrically conductive material 523 can be used to electrically connect tabs 423, 444, 463 and 484, thus providing a simple method for electrically connecting the first output terminal electrodes. Likewise, an electrically conductive material 522 can be used to electrically connect tabs 424, 443, 464 and 483, thus providing a simple method for electrically connecting the second output terminal electrodes. This configuration results in an electrically parallel connection of the output side capacitive regions of ceramic elements 501, 503, 505 and 507.

Electrode 415 and 416 of Type I ceramic element 501 become the first and second terminals for the autonomic auxiliary output of the transformer, respectively.

The parallel input/parallel output configuration of ceramic elements in this embodiment will typically result in a step-down or near unity voltage transform ratio.

Parallel In/Serial Out—Four Stack

Figure 9:
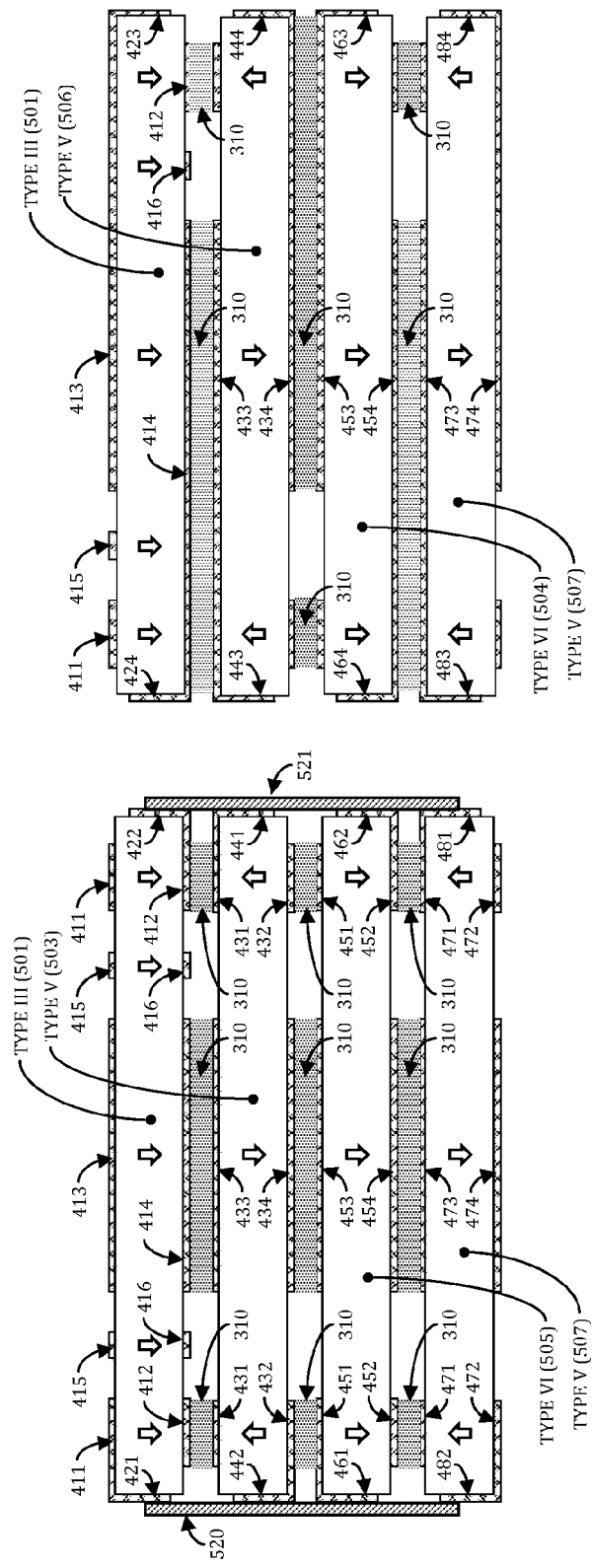
FIG. 9 illustrates an embodiment of a parallel input/serial output four layer autonomic transformer.
Figure 9:
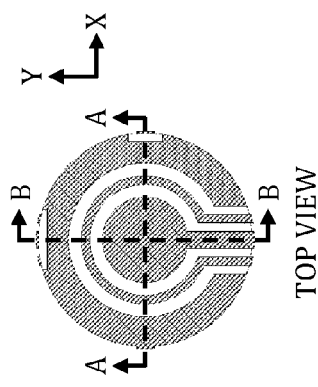

Turning to FIG. 9, it depicts an embodiment of the invention demonstrating a four-layer parallel input/serial output autonomic transformer. In this embodiment a Type III ceramic element 501, Type V ceramic element 503, Type VI ceramic element 505 and a Type V ceramic element 507 are bonded in a manner as described for the four-layer parallel in/parallel out case, depicted in FIG. 8, where the stack arrangement is now Type III, Type V, Type VI, Type V, from top to bottom.

In this embodiment, electrodes 411, 432, 451 and 472 become the first input terminal to the transformer. Electrodes 412, 431, 452 and 471 become the second input terminal to the transformer. An electrically conductive material 520 can be used to electrically connect tabs 421, 442, 461 and 482, thus providing a simple method for electrically connecting the first input terminal electrodes. Likewise, an electrically conductive material 521 can be used to electrically connect tabs 422, 441, 462 and 481, thus providing a simple method for electrically connecting the second input terminal electrodes. This configuration results in an electrically parallel connection of the input side capacitive regions of ceramic elements 501, 503, 505 and 507.

In this embodiment, the first output terminal is taken from electrode 474. The second output terminal is taken from electrode 413. This configuration results in an electrically serial connection of the output side capacitive regions of ceramic elements 501, 503, 505 and 507.

Electrode 415 and 416 of Type III ceramic element 501 become the first and second terminals for the autonomic auxiliary output of the transformer, respectively.

The parallel input/serial output configuration of ceramic elements in this embodiment will typically result in a step-up voltage transform ratio.

Serial In/Parallel Out—Four Stack

Figure 10:
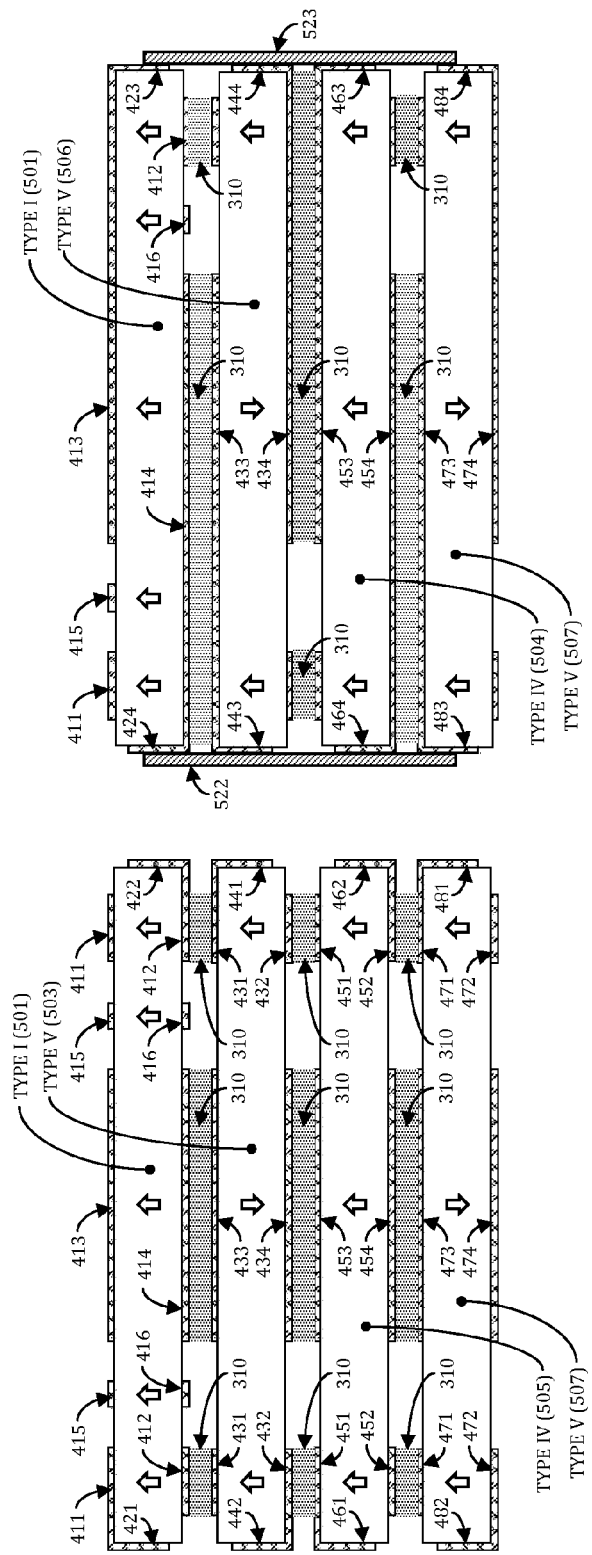
FIG. 10 depicts an embodiment of a serial input/parallel output four layer autonomic transformer.

Turning to FIG. 10, it depicts an embodiment of the invention demonstrating a four-layer serial input/parallel output autonomic transformer. In this embodiment a Type I ceramic element 501, Type V ceramic element 503, Type IV ceramic element 505 and a Type V ceramic element 507 are bonded in a manner as described for the four-layer parallel in/parallel out case, depicted in FIG. 8, where the stack arrangement is now Type I, Type V, Type IV, Type V, from top to bottom.

In this embodiment, the first input terminal is taken from electrode 411. The second input terminal is taken from electrode 472. This configuration results in an electrically serial connection of the output side capacitive regions of ceramic elements 501, 503, 505 and 507.

The first output terminal includes electrodes 413, 434, 453, and 474. The second output terminal includes electrodes 414, 433, 454 and 473. An electrically conductive material 523 can be used to electrically connect tabs 423, 444, 463 and 484, thus providing a simple method for electrically connecting the first output terminal electrodes. Likewise, an electrically conductive material 522 can be used to electrically connect tabs 424, 443, 464 and 483, thus providing a simple method for electrically connecting the second output terminal electrodes. This configuration results in an electrically parallel connection of the output side capacitive regions of ceramic elements 501, 503, 505 and 507.

Electrode 415 and 416 of Type I ceramic element 501 become the first and second terminals for the autonomic auxiliary output of the transformer, respectively.

The serial input/parallel output configuration of ceramic elements in this embodiment will typically result in a step-down voltage transform ratio.

N-Stack

Figure 11:
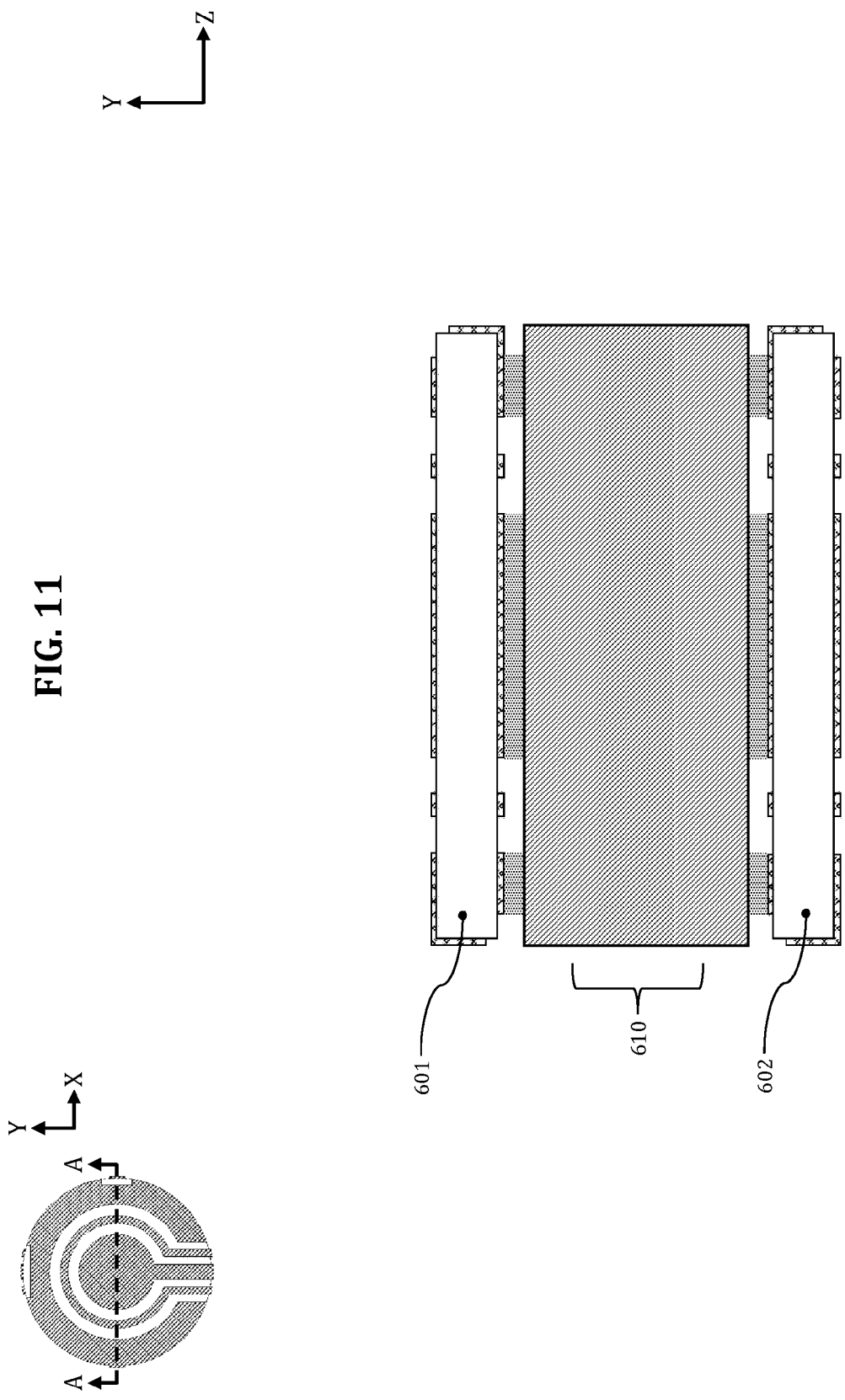
FIG. 11 depicts an embodiment of a multilayer autonomic transformer.

In keeping with the aspect of the invention, any number of modular ceramic elements may be used in numerous combinations and count to form autonomic capable transformers. FIG. 11 depicts an embodiment of a method for modular stacking of ceramic elements. Ceramic elements 601 and 602 are selected based on application needs, where the selection of ceramic element type and arrangement provide means for controlling the input and output impedance characteristics of the autonomic transformer by variation of series/parallel electrical connection. Therefore, in FIG. 11, any number of additional ceramic cores or combinations of stacked ceramics cores can be integrated into the stack within area 610. It is of note that any number of autonomic ready, Type I through Type III, slats can be used within a single stack, providing additional electrically isolated voltage outputs.

As used above "substantially," "generally," "relatively" and other words of degree are relative modifiers intended to indicate permissible variation from the characteristic so modified. It is not intended to be limited to the absolute value or characteristic which it modifies but rather possessing more of the physical or functional characteristic than its opposite, and preferably, approaching or approximating such a physical or functional characteristic.

Although the present invention has been described in terms of particular embodiments, it is not limited to those embodiments. Alternative embodiments, examples, and modifications which would still be encompassed by the invention may be made by those skilled in the art, particularly in light of the foregoing teachings.

Those skilled in the art will appreciate that various adaptations and modifications of the embodiments described above can be configured without departing from the scope and spirit of the invention. Therefore, it is to be understood that, within the scope of the appended claims, the invention may be practiced other than as specifically described herein.

We claim:

1. A modular slat comprising:
   a dielectric member of substantially uniform planar thickness, said dielectric member having first and second opposing faces and a sidewall;
   a first electrode assembly disposed on the first face, said first electrode assembly including:
     an outer electrode disposed along an outer boundary of the first face and having a discontinuous region, the outer electrode including first and second cutouts, the outer electrode further including an outer electrode tab extending along the sidewall from the first face towards the second face;
     an inner electrode disposed substantially concentric with the outer electrode, the inner electrode including a central region and a leg extending from the central region to an edge of the first face and an inner electrode tab extending along the sidewall from the leg towards the second face;
     an insulation region disposed between the first and second electrodes;
   a second electrode assembly disposed on the second face where the second electrode assembly is asymmetrically arranged relative to the first electrode assembly, the second electrode assembly including:
     an outer electrode disposed along an outer boundary of the second face and having a discontinuous region, the outer electrode including first and second cutouts that are aligned with the inner and outer electrode tabs of said first electrode assembly, the outer electrode further including a tab extending along the sidewall from the second face towards the first face and aligned with one of the first and second cutouts;
     an inner electrode disposed substantially concentric with the outer electrode, the inner electrode including a central region and a leg extending from the central region to an edge of the second face and a tab extending along the sidewall from the leg towards the first face and aligned with the other of the first and second cutouts; and
     an insulation region disposed between the first and second electrodes of the second electrode assembly.

2. The modular slat member of claim 1 wherein said dielectric member is uniformly axially polled in the positive z direction.

3. The modular slat of claim 1 wherein said dielectric member is uniformly axially polled in the negative z direction.

4. The modular slat of claim 1 wherein said dielectric member is non-uniformly axially polled and includes regions axially polled in the positive z direction and regions axially polled in the negative z direction.

5. A modular slat comprising:
a dielectric member of substantially uniform planar thickness, said dielectric member having first and second opposing faces and a sidewall;
a first electrode assembly disposed on the first, said first electrode assembly including:
an outer electrode disposed along an outer boundary of the first face and having a discontinuous region, the outer electrode including first and second cutouts, the outer electrode further including an outer electrode tab extending along the sidewall from the first face towards the second face;
an inner electrode disposed substantially concentric with the outer electrode, the inner electrode including a central region and a leg extending from the central region to an edge of the first face and an inner electrode tab extending along the sidewall from the leg towards the second face;
an insulation region disposed between the outer and inner electrodes of the first electrode assembly;
a central electrode disposed in the insulation region substantially concentric with the inner and outer electrodes, the central electrode including at least a first leg extending from the central region to an edge of the first face and a central electrode tab extending along the sidewall from the first leg towards the second face;
a second electrode assembly disposed on the second face where the second electrode assembly is
asymmetrically arranged relative to the first electrode assembly, the second electrode assembly including:
an outer electrode disposed along an outer boundary of the second face and having a discontinuous region, the outer electrode including first and second cutouts that are aligned with the inner, central and outer electrode tabs of said first electrode assembly, the outer electrode further including a tab extending along the sidewall from the second face towards the first face and aligned with one of the first and second cutouts;
an inner electrode disposed substantially concentric with the outer electrode, the inner electrode including a central region and a leg extending from the central region to an edge of the second face and a tab extending along the sidewall from the leg towards the first face and aligned with the other of the first and second cutouts; and
an insulation region disposed between the inner and outer electrodes of the second electrode assembly; and
a central electrode disposed in the insulation region substantially concentric with the inner and outer electrodes, the central electrode including at least a first leg extending to an edge of the second face and a central electrode tab extending along the sidewall from the first leg towards the first face, the tab being in alignment with at least one of the cutouts of the outer electrode of the first face.

6. The modular slat member of claim 5 wherein said dielectric member is uniformly axially polled in the positive z direction.

7. The modular slat of claim 5 wherein said dielectric member is uniformly axially polled in the negative z direction.

8. The modular slat of claim 5 wherein said dielectric member is non-uniformly axially polled and includes regions axially polled in the positive z direction and regions axially polled in the negative z direction.

9. The modular slat of claim 5 wherein the central electrode tab and the inner electrode tab of the first electrode assembly are aligned with the first cutout of the outer electrode of said second electrode assembly.

10. The modular slat of claim 9 wherein the central electrode tab and the inner electrode tab of the second electrode assembly are aligned with the first cutout of the outer electrode of said first electrode assembly.

11. A multilayer ceramic core transformer element comprising:
a ceramic member of substantially uniform thickness, said ceramic member having first and second opposing faces and a sidewall;
a first electrode assembly disposed on the first face, the electrode assembly including at least two electrically isolated electrodes separated by a non-conducting region, said first electrode assembly including a plurality of tabs extending along the sidewall of said ceramic member towards said second face;
a plurality of non-conductive tab receiving regions disposed on the first face of said ceramic member, said tab receiving regions being free from electrodes;
a second electrode assembly disposed on the second face asymmetric with respect to said first electrode assembly, the second electrode assembly including at least two electrically isolated electrodes separated by a non-conducting region, said second electrode assembly including a plurality of tabs extending along the sidewall of said ceramic member towards said first face;
a plurality of non-conductive tab receiving regions disposed on the second face of said ceramic member, said tab receiving regions being free from electrodes, the non-conductive tab receiving regions of the second face being axially aligned with the plurality of tabs of said first electrode assembly and the non-conductive tab regions of the first face being axially aligned with the plurality of tabs of said second electrode assembly.

12. A multilayer ceramic core transformer comprising:
a first ceramic member of substantially uniform thickness, said ceramic member having first and second opposing faces and a sidewall, said first ceramic member including:
a first electrode assembly disposed on the first face, the electrode assembly including at least two electrically isolated electrodes separated by a non-conducting region, said first electrode assembly including a plurality of tabs extending along the sidewall of said ceramic member towards said second face;
a plurality of non-conductive tab receiving regions disposed on the first face of said ceramic member, said tab receiving regions being free from electrodes;
a second electrode assembly disposed on the second face asymmetric with respect to said first electrode assembly, the second electrode assembly including at least two electrically isolated electrodes separated by a non-conducting region, said second electrode assembly including a plurality of tabs extending along the sidewall of said ceramic member towards said first face;

a plurality of non-conductive tab receiving regions disposed on the second face of said ceramic member, said tab receiving regions being free from electrodes, the non-conductive tab receiving regions of the second face being axially aligned with the plurality of tabs of said first electrode assembly and the non-conductive tab regions of the first face being axially aligned with the plurality of tabs of said second electrode assembly; and a second ceramic member of substantially uniform thickness, said ceramic member having first and second opposing faces and a sidewall, said first ceramic member including:

a first electrode assembly disposed on the first face, the electrode assembly including at least two electrically isolated electrodes separated by a non-conducting region, said first electrode assembly including a plurality of tabs extending along the sidewall of said ceramic member towards said second face;

a plurality of non-conductive tab receiving regions disposed on the first face of said ceramic member, said tab receiving regions being free from electrodes;

a second electrode assembly disposed on the second face asymmetric with respect to said first electrode assembly, the second electrode assembly including at least two electrically isolated electrodes separated by a non-conducting region, said second electrode assembly including a plurality of tabs extending along the sidewall of said ceramic member towards said first face;

a plurality of non-conductive tab receiving regions disposed on the second face of said ceramic member, said tab receiving regions being free from electrodes, the non-conductive tab receiving regions of the second face being axially aligned with the plurality of tabs of said first electrode assembly and the non-conductive tab regions of the first face being axially aligned with the plurality of tabs of said second electrode assembly;

said first ceramic member being stacked with said second ceramic member such that the second face of said first ceramic member is substantially parallel with the first face of said second ceramic member and at least one of the plurality of tabs of the second electrode assembly of said first ceramic element is axially aligned with at least one of the plurality of tabs of the first electrode assembly of said second ceramic element.

13. The multilayer ceramic core transformer of claim 12 further comprising an electrically conductive adhesive connecting one the at least two electrodes of the second electrode assembly of the first ceramic element to respective electrodes of the first electrode assembly of the second ceramic element.

14. The multilayer ceramic core voltage transformer of claim 13 wherein at least one tab of the first electrode assembly of the first ceramic member is electrically connected to at least one tab of the second electrode assembly of the second ceramic member.

15. The multilayer ceramic core voltage transformer of claim 14 wherein the first ceramic element is uniformly axially polled in the positive z direction.

16. The multilayer ceramic core voltage transformer of claim 15 wherein the second ceramic element is uniformly polled in the negative z direction.

17. The multilayer ceramic core voltage transformer of claim 15 wherein the second ceramic element includes regions that are axially polled in the positive z direction and regions that are axially polled in the negative z direction.

18. The multilayer ceramic core voltage transformer of claim 14 wherein the first ceramic element includes regions that are axially polled in the positive z direction and regions that are axially polled in the negative z direction.

19. The multilayer ceramic core voltage transformer of claim 18 wherein the second ceramic element is uniformly axially polled in the negative z direction.

20. A method of constructing a multilayer ceramic core transformer comprising:

selecting first and second ceramic elements, each ceramic element comprising:

a ceramic member of substantially uniform thickness, said ceramic member having first and second opposing faces and a sidewall;

a first electrode assembly disposed on the first face, the electrode assembly including at least two electrically isolated electrodes separated by a non-conducting region, said first electrode assembly including a plurality of tabs extending along the sidewall of said ceramic member towards said second face;

a plurality of non-conductive tab receiving regions disposed on the first face of said ceramic member, said tab receiving regions being free from electrodes;

a second electrode assembly disposed on the second face asymmetric with respect to said first electrode assembly, the second electrode assembly including at least two electrically isolated electrodes separated by a non-conducting region, said second electrode assembly including a plurality of tabs extending along the sidewall of said ceramic member towards said first face;

a plurality of non-conductive tab receiving regions disposed on the second face of said ceramic member, said tab receiving regions being free from electrodes, the non-conductive tab receiving regions of the second face being axially aligned with the plurality of tabs of said first electrode assembly and the non-conductive tab regions of the first face being axially aligned with the plurality of tabs of said second electrode assembly;

arranging the first and second ceramic elements in a stacked configuration such that the electrode assembly of the second face of the first ceramic element is coincident with the electrode assembly of first face of the second ceramic element;

bonding the electrodes of the second face of the first ceramic element to opposing electrodes of the first face of the second ceramic element;

electrically connecting at least one of the tabs of the first electrode assembly of the first ceramic element to at least one of the tabs of the second electrode assembly of said second ceramic element.

* * * * *